(12) United States Patent
Kobayashi

(10) Patent No.: US 7,046,096 B2
(45) Date of Patent: May 16, 2006

(54) OSCILLATOR CIRCUIT, OSCILLATOR CIRCUIT ADJUSTING METHOD, AND MASS MEASURING APPARATUS USING OSCILLATOR CIRCUIT

(75) Inventor: Yoshihiro Kobayashi, Komagane (JP)

(73) Assignee: Seiko Epson Corporation, (JP)

( * ) Notice: Subject to any disclaimer, the term of this patent is extended or adjusted under 35 U.S.C. 154(b) by 75 days.

(21) Appl. No.: 10/801,111

(22) Filed: Mar. 15, 2004

(65) Prior Publication Data
US 2004/0233008 A1 Nov. 25, 2004

(30) Foreign Application Priority Data
Mar. 17, 2003 (JP) ............................. 2003-072363
Jan. 21, 2004 (JP) ............................. 2004-013195

(51) Int. Cl.
*H03B 5/23* (2006.01)
(52) U.S. Cl. ..................................... 331/135; 331/158
(58) Field of Classification Search ................. 331/135, 331/158
See application file for complete search history.

(56) References Cited

U.S. PATENT DOCUMENTS

| | | | |
|---|---|---|---|
| 4,639,697 A | * | 1/1987 | Yarranton et al. ......... 333/155 |
| 5,874,866 A | * | 2/1999 | Satoh et al. ............ 331/107 A |
| 2003/0016090 A1 | | 1/2003 | Kobayashi |
| 2004/0140857 A1 | * | 7/2004 | Ogiso ................... 331/107 A |

FOREIGN PATENT DOCUMENTS

| | | |
|---|---|---|
| JP | 11-163633 | 6/1999 |
| JP | 2001-289765 | 10/2001 |
| JP | 2003-101347 | 4/2003 |

OTHER PUBLICATIONS

Patent Abstracts of Japan regarding Publication No. 11-163633 published Jun. 18, 1999.
Patent Abstracts of Japan regarding Publication No. 2001-289765 published Oct. 19, 2001.
Patent Abstracts of Japan regarding Publication No. 2003-101347 published Apr. 4, 2003.

* cited by examiner

*Primary Examiner*—Joesph Chang
(74) *Attorney, Agent, or Firm*—Harness, Dickey & Pierce, P.L.C.

(57) ABSTRACT

An oscillator circuit is a closed loop including an amplifying circuit and a feedback circuit. The amplifying circuit includes a pair of amplifiers, which also function as impedance buffers, and a first phase-shift circuit. The feedback circuit includes a second phase-shift circuit and a piezoelectric vibrator. The second phase-shift circuit is capable of adjusting the phase and gain of the feedback circuit. The first phase-shift circuit of the amplifying circuit is arranged between the pair of amplifiers and is separated, in terms of impedance, from the second phase-shift circuit. The first phase-shift circuit is capable of adjusting the phase of the entire closed loop.

24 Claims, 17 Drawing Sheets

10: OSCILLATOR CIRCUIT
20: AMPLIFYING CIRCUIT
22, 24: AMPLIFIER
26: FIRST PHASE-SHIFT CIRCUIT
30: FEEDBACK CIRCUIT
32: SECOND PHASE-SHIFT CIRCUIT
34: PIEZOELECTRIC VIBRATOR

10: OSCILLATOR CIRCUIT
20: AMPLIFYING CIRCUIT
22, 24: AMPLIFIER
26: FIRST PHASE-SHIFT CIRCUIT
30: FEEDBACK CIRCUIT
32: SECOND PHASE-SHIFT CIRCUIT
34: PIEZOELECTRIC VIBRATOR

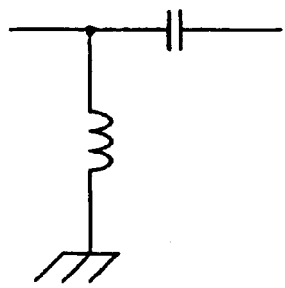
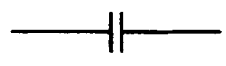
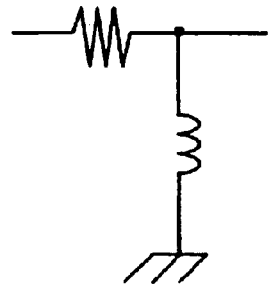
FIG. 2A  FIG. 2B  FIG. 2C
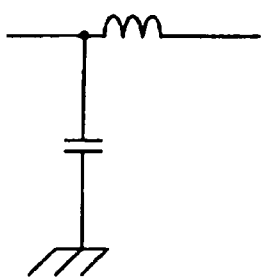
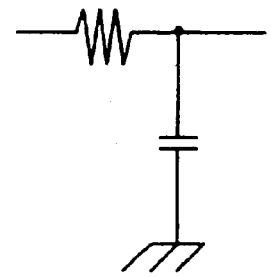
FIG. 3A  FIG. 3B  FIG. 3C

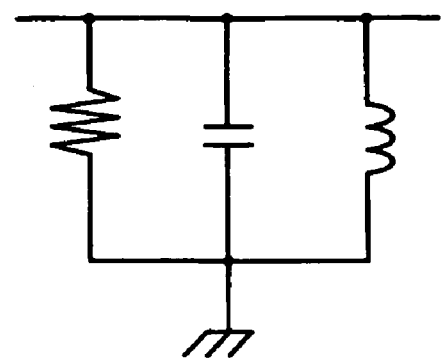
FIG. 4A    FIG. 4B
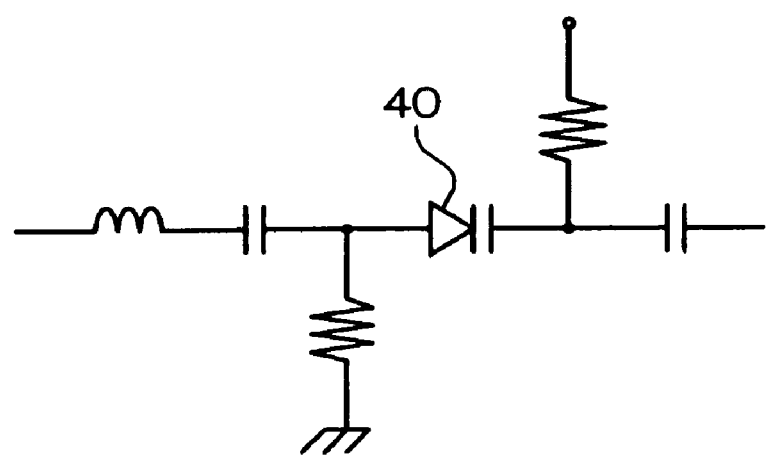
FIG. 5

OSCILLATOR CIRCUIT, OSCILLATOR CIRCUIT ADJUSTING METHOD, AND MASS MEASURING APPARATUS USING OSCILLATOR CIRCUIT

RELATED APPLICATIONS

This application claims priority to Japanese Patent Application No. 2003-072363 filed Mar. 17, 2003 and 2004-013195 filed Jan. 21, 2004 which are hereby expressly incorporated by reference herein in their entireties.

BACKGROUND

1. Technical Field

The present invention relates to oscillator circuits for piezoelectric vibrators, and more particularly, to an oscillator circuit suitable for causing a piezoelectric vibrator immersed in liquid to oscillate, an oscillator circuit adjusting method, and a mass measuring apparatus using the oscillator circuit.

2. Background Art

In recent years, quartz crystal microbalances (QCMs) using a quartz vibrator, which is a piezoelectric vibrator, have been receiving attention. QCMs utilize the fact that deposition of a substance on an electrode of a quartz vibrator reduces the oscillation frequency. Since QCMs are capable of detecting masses on the order of nanograms (ng) or less, QCMs are applied, as biosensors, chemical sensors, and the like, to detect micro materials in a wide range of fields, such as medical, biochemical, food, and environmental measurement.

For example, in some cases, quartz vibrators immersed in liquid are used as mass measuring apparatuses. The effective crystal impedance (hereinafter, referred to as a "CI value") of quartz vibrators in air is very different from that of quartz vibrators in liquid; the CI value in liquid is about ten to thirty times larger than the CI value in air. Since the increase in the CI value makes oscillation of quartz vibrators more difficult, it is difficult to cause quartz vibrators in liquid to oscillate with the same circuit conditions for causing quartz vibrators in air to oscillate. Thus, oscillation of quartz vibrators in liquid has been made possible by increasing the amplification of an oscillator circuit (for example, Japanese Unexamined Patent Application Publication No. 11-163633 (Paragraph No. 0004 and FIG. 1)). Also, an oscillator circuit that causes a plurality of quartz vibrators having different fundamental frequencies to oscillate by the same circuit by using inverters made of high speed CMOS devices has been proposed (Japanese Unexamined Patent Application Publication No. (Paragraph No. 0015)). In Patent Document 2001-289765, however, the operation only in a gas phase is suggested.

Since an oscillator circuit is a feedback circuit that forms an oscillator loop, if oscillation conditions of the oscillator loop are satisfied, oscillation may occur but not by way of a vibrator, or even in the case where the oscillation does occur by way of the vibrator, the oscillation may occur at a frequency that is not the resonance frequency of the vibrator. Thus, if the amplification is increased, as in Patent Document 11-163633, such undesirable oscillation is likely to occur. Also, in a case where the oscillator circuit is incorporated in the actual circuit, the oscillator circuit is electrically connected to various other circuits. Thus, if the amplification of the oscillator circuit is increased, oscillation may occur in the various other circuits that are not provided with vibrators. Therefore, it is difficult to achieve stable oscillation merely by increasing the amplification.

FIG. 20 shows the variation in the CI value of a piezoelectric vibrator in air with respect to frequency and the variation in the CI value of a piezoelectric vibrator in liquid with respect to frequency. In air, the CI value of the piezoelectric vibrator that oscillates at a frequency of 148.25 MHz is about 20Ω. In contrast, in liquid, the CI value of the piezoelectric vibrator that oscillates at a frequency of 148.25 MHz is about 300Ω. Thus, it is difficult to cause the piezoelectric vibrator to oscillate in liquid by using the circuit that oscillates in air, as in the technology of Patent Document 2001-289765.

FIG. 21 shows the variation in phase of a piezoelectric vibrator in air with respect to frequency and the variation in phase of a piezoelectric vibrator in liquid with respect to frequency. In air, the phase of the piezoelectric vibrator is abruptly changed from −90 degrees to +90 degrees at a frequency near 148.25 MHz. In contrast, in liquid, the phase of the piezoelectric vibrator is only changed between about −90 degrees and about −50 degrees, not only at a frequency near 148.25 MHz, but also in a frequency range between 147.8 MHz and 148.6 MHz. Accordingly, the phase does not abruptly change. Thus, in Patent Document 2001-289765, an amplifier includes an inverter and the phase at the output side of the amplifier is always 180 degrees different from the phase at the input side of the amplifier. In other words, the phase at the output side of the amplifier cannot be equal to the phase at the input side of the amplifier.

In order to solve the problems described above, an object of the present invention is to ensure oscillation both in air and liquid.

Also, another object of the present invention is to ensure prevention of undesirable oscillation, such as parasitic oscillation, spurious oscillation, and feedback oscillation.

SUMMARY

FIG. 22 is a block diagram showing the circuit structure of an oscillator circuit. The oscillator circuit includes an amplifying circuit and a feedback circuit, as shown in FIG. 22. The oscillation conditions of the oscillator circuit are represented by the following formulae:

$Re(A\beta) \geq 1$(power condition)   Formula 1

$Im(A\beta) = 0$(frequency condition),   Formula 2 where A represents the gain of the amplifying circuit and β represents the feedback ratio of the feedback circuit. Here, $Re(A\beta)$ and $Im(A\beta)$ represent the real part and the imaginary part, respectively, of a complex quantity $A\beta$. As described above, in order to cause the oscillator circuit to oscillate, the amplification, which is a power condition, must be 1 or more and the phase of an oscillator loop must be 0 degrees. Thus, a phase-shift circuit is provided both in the amplifying circuit and the feedback circuit, so that the phase-shift circuit in the amplifying circuit can adjust the phase of the entire loop. Thus, a phase condition, which is one of the oscillation conditions, is satisfied so that an influence of the feedback circuit (feedback loop) on the gain is minimized.

In other words, an oscillator circuit according to the present invention includes a plurality of amplifiers, which also function as impedance buffers; a first phase-shift circuit connected between the amplifiers, the first phase-shift circuit being capable of adjusting the phase of an oscillator loop; a feedback circuit, an input side of the feedback circuit being connected to an output terminal of the amplifier that is connected to an output side of the first phase-shift circuit, an output side of the feedback circuit being connected to an input terminal of the amplifier that is connected to an input side of the first phase-shift circuit; a second phase-shift circuit provided in the feedback circuit and capable of adjusting the phase and gain of the oscillator loop; and a piezoelectric vibrator provided in the feedback circuit and connected in series with the second phase-shift circuit.

As described above, in order to satisfy the phase condition for oscillation and the gain condition of the oscillator loop both in gas, such as air, and liquid, the amount of phase shift of the entire oscillator loop is adjusted to an appropriate value by the first phase-shift circuit. Also, in order to obtain an oscillator loop gain and to achieve the phase condition for stable oscillation, the reactance of the second phase-shift circuit arranged in the feedback circuit is adjusted. Since the first phase-shift circuit is separated from the second phase-shift circuit in terms of impedance by the amplifiers having a buffer function due to impedance conversion, the phase of the entire closed loop can be adjusted irrespective of the gain characteristics of the feedback circuit. Thus, the phase condition and gain condition of the oscillator circuit are satisfied so that stable and easy oscillation of the piezoelectric vibrator both in air and liquid can be ensured.

The phase-shift circuit may include a tank circuit that resonates at an oscillation frequency of the vibrator. Thus, even if the amplification of the oscillator loop is increased, undesirable oscillation, such as parasitic oscillation, spurious oscillation, and feedback oscillation, can be avoided. In other words, an input frequency equal to the resonance frequency of the tank circuit rapidly increases the impedance when viewed from the closed loop side, and an input frequency deviated from the resonance frequency reduces the impedance. Thus, by setting the resonance frequency of the tank circuit to be substantially equal to the oscillation frequency of the piezoelectric vibrator, the amplification of the closed loop at frequencies other than the oscillation frequency of the piezoelectric vibrator is reduced. Therefore, undesirable oscillation, such as parasitic oscillation, spurious oscillation, and feedback oscillation, can be avoided.

At least one of the first phase-shift circuit and the second phase-shift circuit may include a voltage-controlled phase-shift circuit capable of adjusting the phase of the oscillator loop in accordance with a control voltage from the outside. The impedance characteristics of a piezoelectric vibrator in a liquid change depending on the state of the liquid, the wettability of the liquid to the piezoelectric vibrator, the contact condition of the liquid to the surface of the piezoelectric vibrator, and the like. By the phase-shift circuit formed by the voltage-controlled phase-shift circuit, the oscillator circuit can be precisely adjusted. Thus, a stable operation of the oscillator circuit in liquid can be achieved.

Also, each of the amplifiers may be a differential amplifier including an inverting input terminal, a non-inverting input terminal, an inverting output terminal, and a non-inverting output terminal. The differential amplifier may be an emitter-coupled logic circuit. The piezoelectric vibrator may be any one of an AT-cut quartz vibrator, a reverse-mesa AT-cut quartz vibrator, and a surface acoustic wave (SAW) vibrator.

An adjusting method according to the present invention for adjusting the oscillator circuit includes a gain and phase calculation step of measuring the circuit characteristics of the oscillator circuit and of calculating the gain and phase of the oscillator loop at the oscillation frequency of the oscillator circuit when the piezoelectric vibrator is disposed in gas and when the piezoelectric vibrator is disposed in liquid; and an adjusting step of performing an adjustment so as to satisfy a first phase-adjusting step of changing a circuit constant of the first phase-shift circuit of the oscillator circuit to perform coarse adjustment for adjusting the phase such that the phase of the oscillator loop is about 0 at frequencies near the principal vibration frequency when the piezoelectric vibrator is disposed in gas and when the piezoelectric vibrator is disposed in liquid; a second phase-adjusting step of changing a circuit constant of the second phase-shift circuit of the oscillator circuit to adjust the phase of the oscillator loop to 0 at a frequency near the oscillation frequency and near the resonance frequency of the vibrator when the piezoelectric vibrator is disposed in gas and when the piezoelectric vibrator is disposed in liquid; and a gain adjusting step of adjusting the gain of the oscillator loop to 1 or more.

Preferably, in the gain adjusting step, a negative resistance is set to be three or more times larger than the impedance of the piezoelectric vibrator. Thus, oscillation of the piezoelectric vibrator can be ensured. Also, preferably, each of the steps for adjusting the oscillator circuit is performed when the oscillator circuit is an open loop. Thus, adjustment of the oscillator circuit can be easily performed.

A mass measuring apparatus according to the present invention includes the oscillator circuit described above. Thus, a mass measuring apparatus achieving stable oscillation both in gas and liquid can be provided, and a QCM with high reliability can be provided.

BRIEF DESCRIPTION OF THE DRAWINGS

FIGS. 2A–C show an example of a phase-advance circuit constituting a phase-shift circuit according to the first embodiment.

FIGS. 3A–C show an example of a phase-delay circuit constituting the phase-shift circuit according to the first embodiment.

FIGS. 4A–B show examples of a resonance circuit constituting the phase-shift circuit according to the first embodiment.

FIG. 5 shows an example of a reactance control circuit constituting the phase-shift circuit according to the first embodiment.

DETAILED DESCRIPTION

The best mode for an oscillator circuit, an oscillator circuit adjusting method, and a mass measuring apparatus using the oscillator circuit according to the present invention will be described in detail with reference to the drawings.

Figure 1:
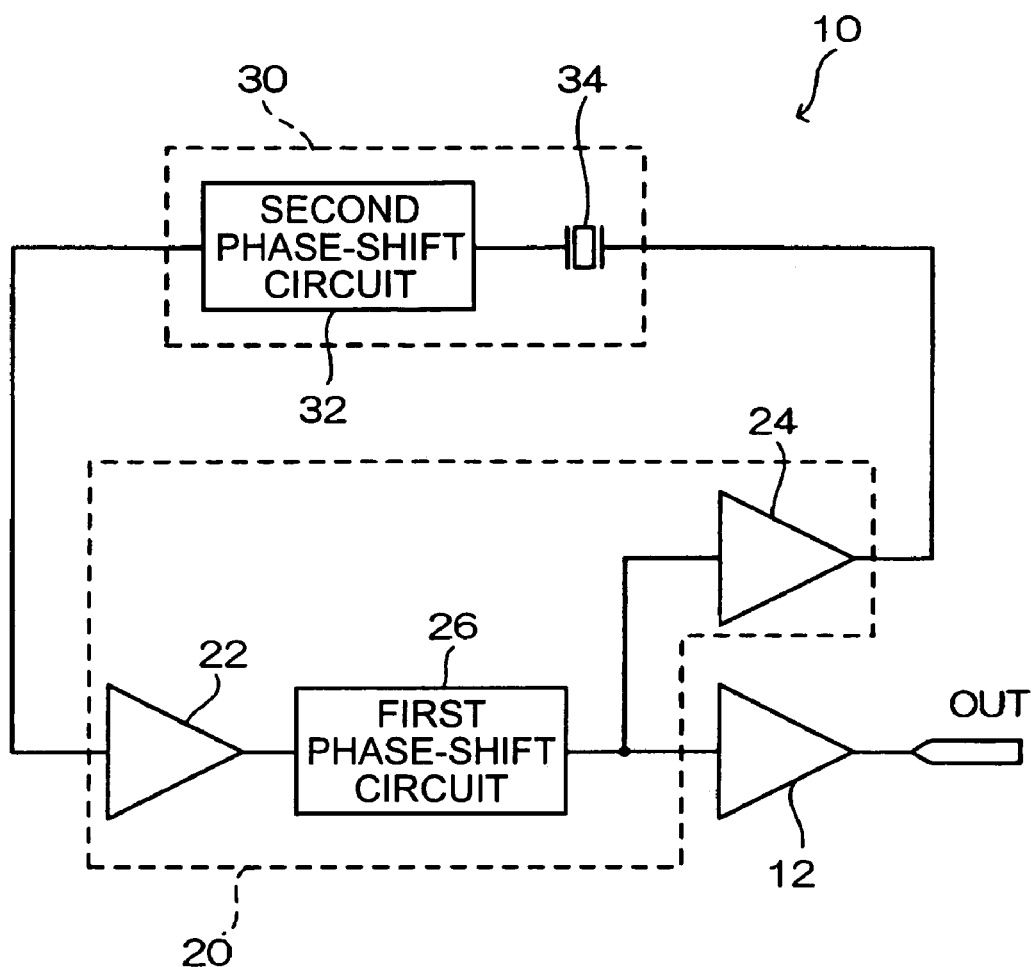
FIG. 1 is a diagram showing a piezoelectric vibrator oscillator circuit according to a first embodiment.

FIG. 1 is a block diagram showing an oscillator circuit 10 for a piezoelectric vibrator according to a first embodiment. In FIG. 1, the oscillator circuit 10 includes an amplifying circuit 20 and a feedback circuit 30. The amplifying circuit 20 includes a plurality of amplifiers 22 and 24, which also function as impedance buffers, and a first phase-shift circuit 26. The first phase-shift circuit 26 is arranged between the amplifiers 22 and 24. The input side of the first phase-shift circuit 26 is connected to the output terminal of the amplifier 22 and the output side of the first phase-shift circuit 26 is connected to the input terminal of the amplifier 24.

Also, the feedback circuit 30 includes a second phase-shift circuit 32 and a piezoelectric vibrator 34 connected to the input side of the second phase-shift circuit 32. The input side of the second phase-shift circuit 32 is connected to the output terminal of the amplifier 24 with the piezoelectric vibrator 34 therebetween. The output side of the second phase-shift circuit 32 is connected to the input terminal of the amplifier 22. Accordingly, the oscillator circuit 10 is a closed loop including the amplifying circuit 20 and the feedback circuit 30. An output buffer 12 is connected to the output side of the first phase-shift circuit 26 of the amplifying circuit 20 so as to be in parallel with the amplifier 24.

The piezoelectric vibrator 34 may be connected to the output side of the second phase-shift circuit 32, in other words, to the input side of the amplifier 22. Also, the second phase-shift circuit 32 may include a plurality of phase-shift circuit elements, and the piezoelectric vibrator 34 may be arranged among the phase-shift circuit elements. The output buffer 12 may be connected to the output side of the amplifying circuit 20, in other words, to the output terminal of the amplifier 24.

Each of the amplifiers 22 and 24, which also function as impedance buffers, may be an amplifying circuit using a transistor, an operational amplifier (Op-Amp), a differential amplifier, emitter coupled logic (ECL), positive ECL (PECL), or the like. The piezoelectric vibrator 34 may be a quartz vibrator or a lithium tetraborate ($Li_2B_4O_7$(LBO)) vibrator. Also, the piezoelectric vibrator 34 may be an AT-cut vibrator, a BT-cut vibrator, a GT-cut vibrator, an SC-cut vibrator, a quartz-crystal filter, a SAW vibrator, or a SAW filter.

Examples of equivalent circuits and structures of the first phase-shift circuit 26 and the second phase-shift circuit 32 will now be described. Each equivalent circuit of the first phase-shift circuit 26 and the equivalent circuit of the second phase-shift circuit 32 can be formed by a phase-advance circuit for advancing the phase, a phase-delay circuit for delaying the phase, or a resonance circuit. For example, FIGS. 2(A) to (C) show an example of the phase-advance circuit. FIGS. 3(A) to (C) show an example of the phase-delay circuit. Also, FIG. 4(A) shows an example of a series resonance circuit, and FIG. 4(B) shows an example of a parallel resonance circuit. Furthermore, FIG. 5 shows a voltage-controlled reactance control circuit using a variable capacitance diode 40. As described above, the equivalent circuit of the first phase-shift circuit 26 and the equivalent circuit of the second phase-shift circuit 32 can be formed by any circuit shown in FIGS. 2 to 5.

Figure 6A:
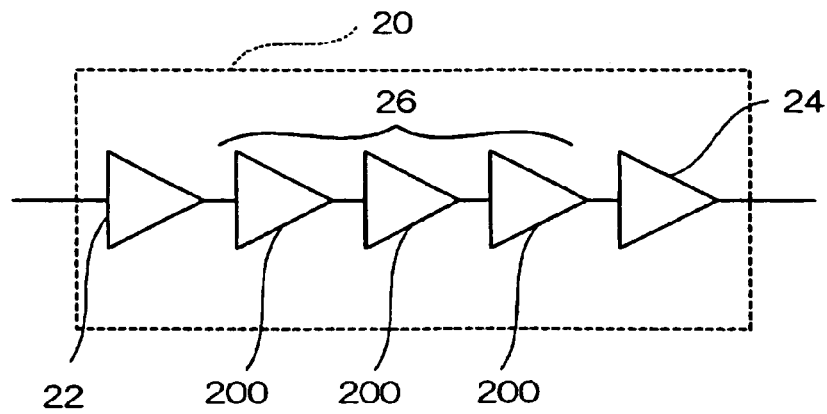
FIGS. 6A–C show examples of the structure of a first phase-shift circuit according to the first embodiment.
Figure 6B:
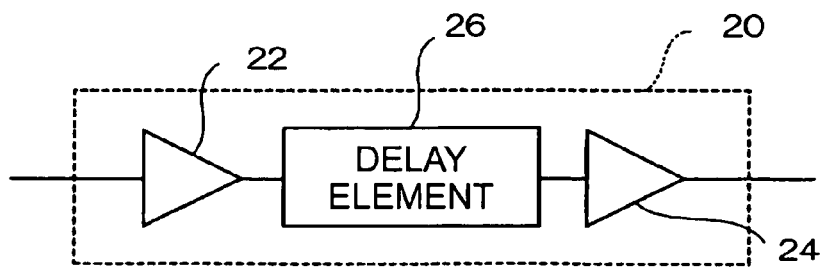
Figure 6C:
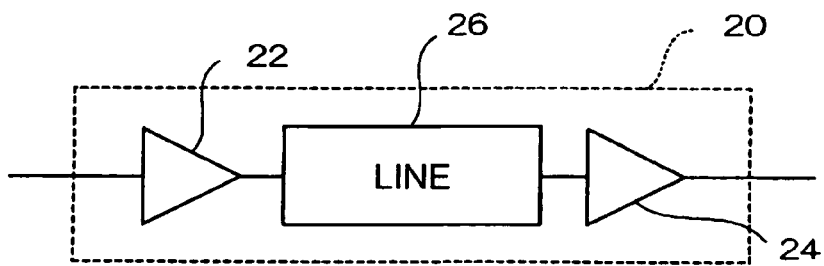

FIGS. 6(A)–(C) include specific examples of the structure of the first phase-shift circuit 26 or the structure of the second phase-shift circuit 32. FIG. 6(A) shows an example in which amplifiers 200 are connected in series with each other. Here, the number of the amplifiers 200 is not particularly limited as long as one or more amplifiers 200 are provided. FIG. 6(B) shows an example in which a delay element is arranged. The delay element may be a distributed-constant element, such as a variable capacitance diode or a thermistor. FIG. 6(C) shows an example in which the first phase-shift circuit 26 or the second phase-shift circuit 32 is formed by a line. The line may be a stripline, a microstrip line, or the like.

In the oscillator circuit 10 according to the first embodiment arranged as described above, the loop phase and the loop gain can be individually adjusted such that the conditions for oscillation of the piezoelectric vibrator 34 both in air and liquid are satisfied. Thus, the oscillator circuit 10 according to the first embodiment is able to ensure oscillation of the piezoelectric vibrator 34 both in air (gas) and liquid. Also, stable oscillation can be achieved with respect to the characteristics of various liquids. Accordingly, the use of the oscillator circuit 10 easily provides a mass measuring apparatus with high reliability, such as a chemical sensor, biosensor, and a QCM.

Figure 7:
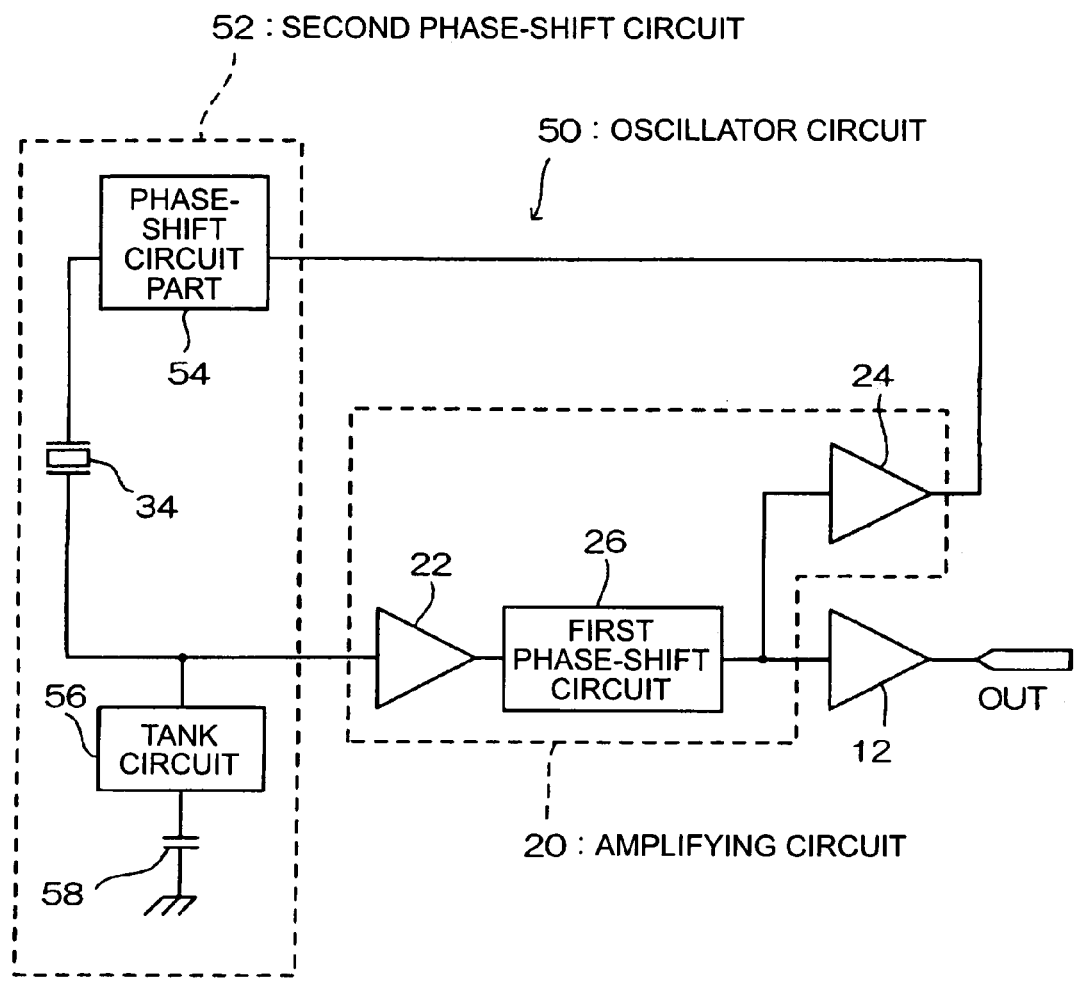
FIG. 7 is a diagram showing a piezoelectric vibrator oscillator circuit according to a second embodiment.

FIG. 7 is a block diagram showing a piezoelectric vibrator oscillator circuit 50 according to a second embodiment. In FIG. 7, the oscillator circuit 50 is a closed loop including the amplifying circuit 20 and a second phase-shift circuit 52 functioning as a feedback circuit. The second phase-shift circuit 52 includes a phase-shift circuit part 54, the piezoelectric vibrator 34, and a tank circuit 56. The piezoelectric vibrator 34 may be arranged on the input side of the second phase-shift circuit 52.

The phase-shift circuit part 54 can be arranged in a similar manner to the first phase-shift circuit 26 and the second phase-shift circuit 32 (see FIG. 1). The input side of the phase-shift circuit part 54 is connected to the output terminal of the amplifier 24 constituting the amplifying circuit 20. Also, the output side of the phase-shift circuit part 54 is connected to one electrode of the piezoelectric vibrator 34. The other electrode of the piezoelectric vibrator 34 is connected to the input terminal of the amplifier 22 constituting the amplifying circuit 20. The tank circuit 56 is a parallel resonance circuit including a capacitance element and an inductance element. One end of the tank circuit 56 is connected between the piezoelectric vibrator 34 and the input terminal of the amplifier 22. The other end of the tank circuit 56 is grounded via a capacitor 58. The tank circuit 56 is adjusted such that resonance occurs at a predetermined frequency, that is, the oscillation frequency of the piezoelectric vibrator 34. The capacitor 58 is grounded such that the tank circuit 56 DC-floats.

Figure 23:
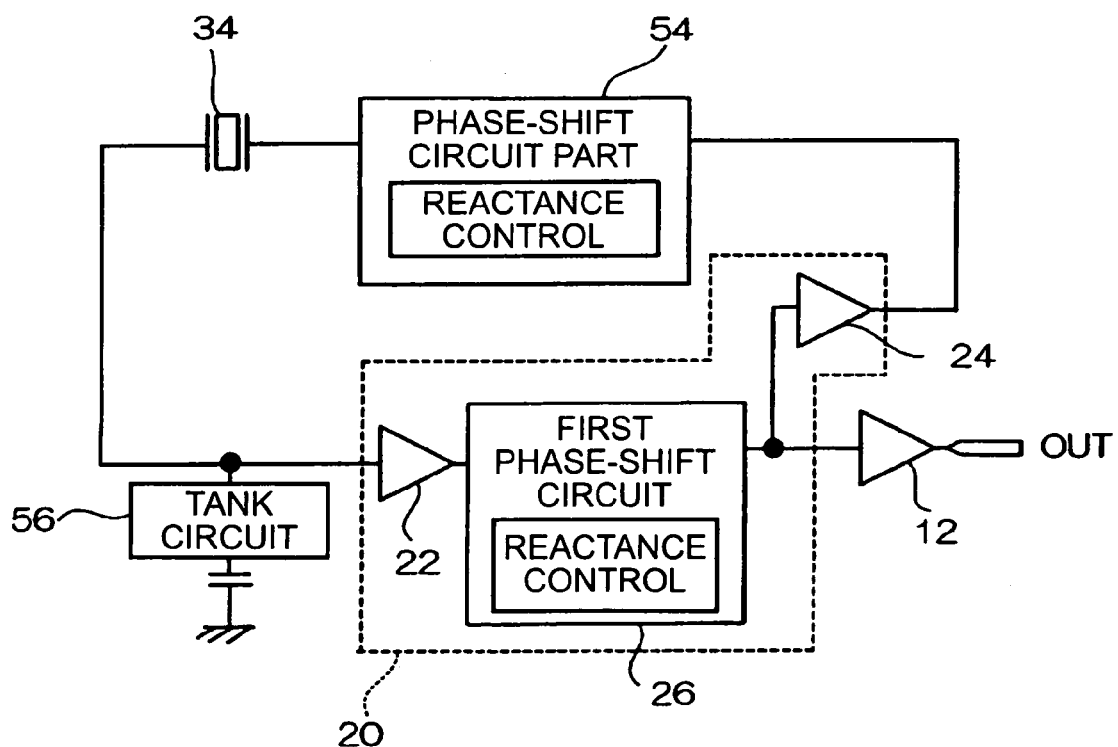
FIG. 23 is an explanatory diagram showing a modification of the second embodiment in which a reactance control circuit is used.

FIG. 23 shows a modification of the second embodiment. In this modification, each of the first phase-shift circuit 26 and the phase-shift circuit part 54 of the second phase-shift circuit 52 is a voltage-controlled phase-shift circuit and includes a voltage-controlled reactance control circuit. Accordingly, when the piezoelectric vibrator 34 is immersed in liquid, stable oscillation can be achieved irrespective of the type of liquid. In other words, the impedance characteristics of piezoelectric vibrators in a liquid change depending on the state of the liquid, the wettability of the liquid to the piezoelectric vibrator, the contact condition of the liquid to the surface of the piezoelectric vibrator, and the like. By providing the voltage-controlled reactance control circuits in the phase-shift circuits, as shown in FIG. 23, a circuit constant of the oscillator circuit 50 can be precisely adjusted. Thus, stable operation of the oscillator circuit 50 in liquid can be achieved, and stable oscillation of the piezoelectric vibrator 34 can thus be ensured. Of course, each of the first phase-shift circuit 26 and the second phase-shift circuit 32 in the first embodiment may be arranged so as to include a voltage-controlled reactance control circuit.

Figure 8:
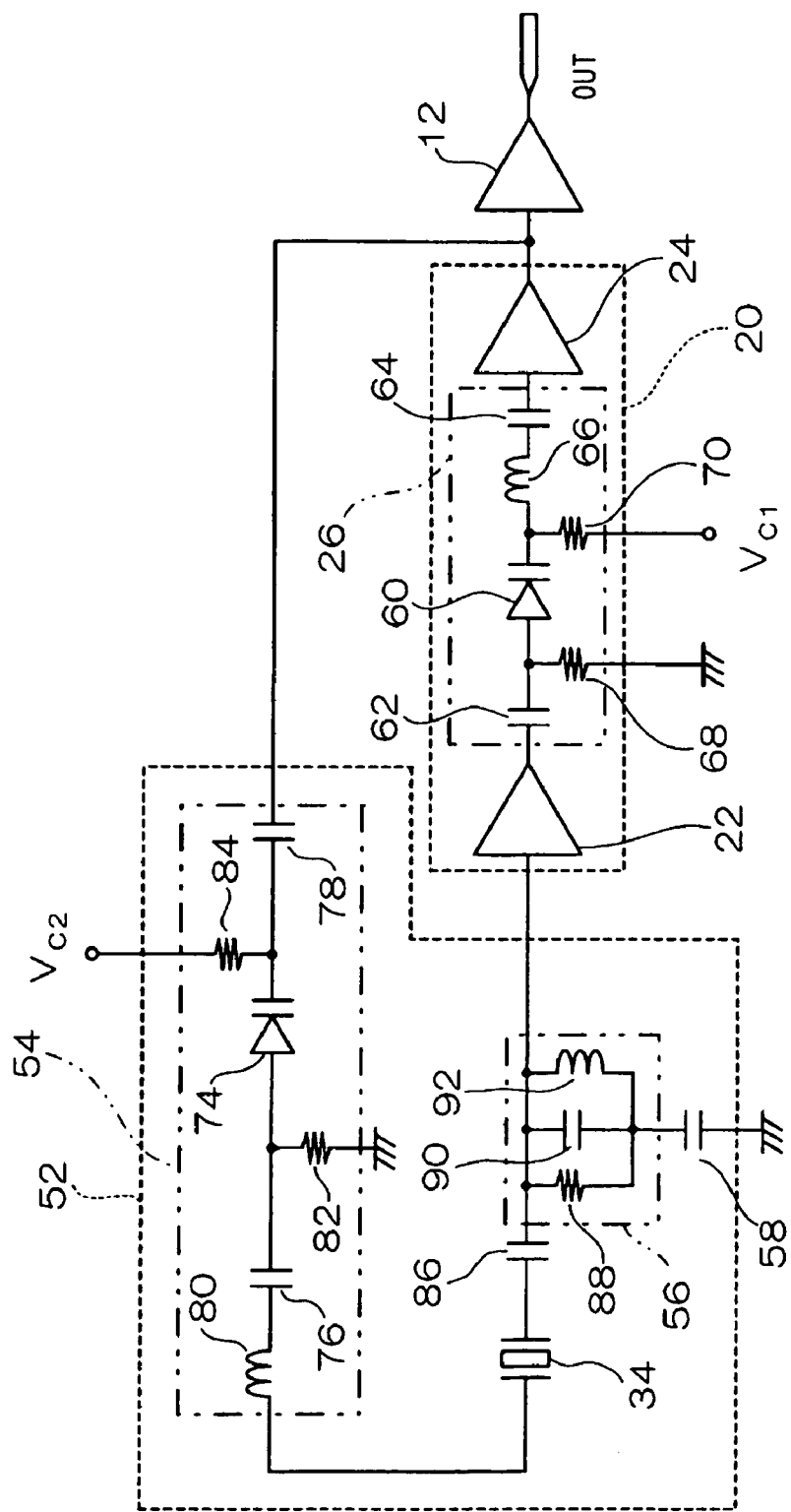
FIG. 8 is a circuit diagram showing a specific example of a modification of the second embodiment.

FIG. 8 shows a specific example of the oscillator circuit 50 according to a modification of the second embodiment. In FIG. 8, each of the first phase-shift circuit 26 and the second phase-shift circuit 52 includes a voltage-controlled reactance control circuit using a variable capacitance diode, a coil functioning as a phase-shift circuit element, and DC-cutting capacitors. In this specific example, the output buffer 12 is connected to the output terminal of the amplifier 24, which is the output terminal of the amplifying circuit 20.

The first phase-shift circuit 26 of the amplifying circuit 20 includes a variable capacitance diode 60, two coupling capacitors 62 and 64 for cutting DC components, a coil 66 functioning as a phase-shift element, and two resistors 68 and 70. In other words, in the first phase-shift circuit 26, the anode of the variable capacitance diode 60 is connected to the output terminal of the amplifier 22 with the coupling capacitor 62 therebetween and is grounded via the resistor 68. Also, the cathode of the variable capacitance diode 60 is connected to the input terminal of a control voltage $V_{C1}$ input from the outside via the resistor 70 and is connected to one end of the coil 66. The other end of the coil 66 is connected to the input terminal of the amplifier 24 via the coupling capacitor 64. Accordingly, the variable capacitance diode 60 and the two resistors 68 and 70 constitute the voltage-controlled reactance control circuit.

In contrast, the second phase-shift circuit 52 includes a variable capacitance diode 74, two coupling capacitors 76 and 78 for cutting DC components, a coil 80 functioning as a phase-shift element, and two resistors 82 and 84. The anode of the variable capacitance diode 74 is connected to one end of the coupling capacitor 76 and is grounded via the resistor 82. The other end of the coupling capacitor 76 is connected to one end of the coil 80. The other end of the coil 80 is connected to one electrode of the piezoelectric vibrator 34. Also, the cathode of the variable capacitance diode 74 is connected to one end of the coupling capacitor 78 and is connected to the input terminal of a control voltage $V_{C2}$ input from the outside via the resistor 84. The other end of the coupling capacitor 78 is connected to the output terminal of the amplifier 24. Accordingly, the variable capacitance diode 74 and the two resistors 82 and 84 constitute the voltage-controlled reactance control circuit.

The other electrode of the piezoelectric vibrator 34 is connected to the input terminal of the amplifier 22 via a coupling capacitor 86 and the tank circuit 56. The tank circuit 56 is a parallel resonance circuit in which a resistor 88 for adjusting the Q factor of the tank circuit 56, a capacitor 90, and a coil 92 are connected in parallel with each other. In the second embodiment, in order to prevent undesirable oscillation, the inductance of the coil 92 and the capacitance of the capacitor 90 are determined in the tank circuit 56 such that the range of the resonance frequency is reduced.

The influence on the phase change with respect to frequency and the influence on the gain with respect to frequency of a circuit that changes the phase will now be described.

Figure 9:
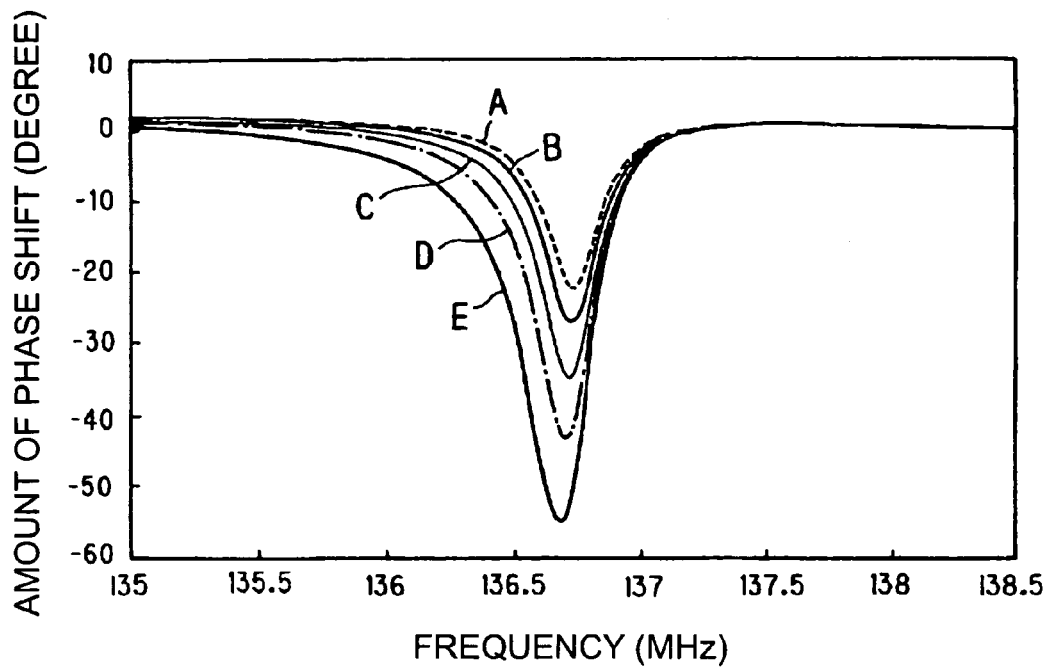
FIG. 9 shows a state in which the phase is changed by a phase-shift circuit of a feedback circuit.

FIG. 9 shows a state in which the amount of variation in the phase is changed by using only the second phase-shift circuit 52. As described above, when the piezoelectric vibrator 34 is immersed in liquid after the oscillator circuit 50 is adjusted such that the piezoelectric vibrator 34 oscillates in air, the piezoelectric vibrator 34 cannot oscillate because the impedance increases and the phase of the piezoelectric vibrator 34 does not change very much. A state in which the amount of phase shift in the feedback circuit is changed only by using the second phase-shift circuit 52 such that the piezoelectric vibrator 34 oscillates even in liquid is shown in FIG. 9. For example, when the inductance of the coil 80 constituting the second phase-shift circuit 52 is adjusted and the phase of the feedback circuit is delayed, the amount of change in the phase is increased from the curved lines A to E in that order. Delaying the phase of the feedback circuit increases the width of frequencies at which the phase changes. Thus, the piezoelectric vibrator 34 oscillates at a frequency that is away (far) from the oscillation frequency of the piezoelectric vibrator 34. Therefore, a current flowing in the piezoelectric vibrator 34 is reduced, thus reducing the stability of a frequency at which the piezoelectric vibrator 34 oscillates. In other words, in a case where such the piezoelectric vibrator 34 is used for an apparatus for measuring a very small amount of mass, the S/N ratio is deteriorated, thus reducing the measurement accuracy.

Figure 10:
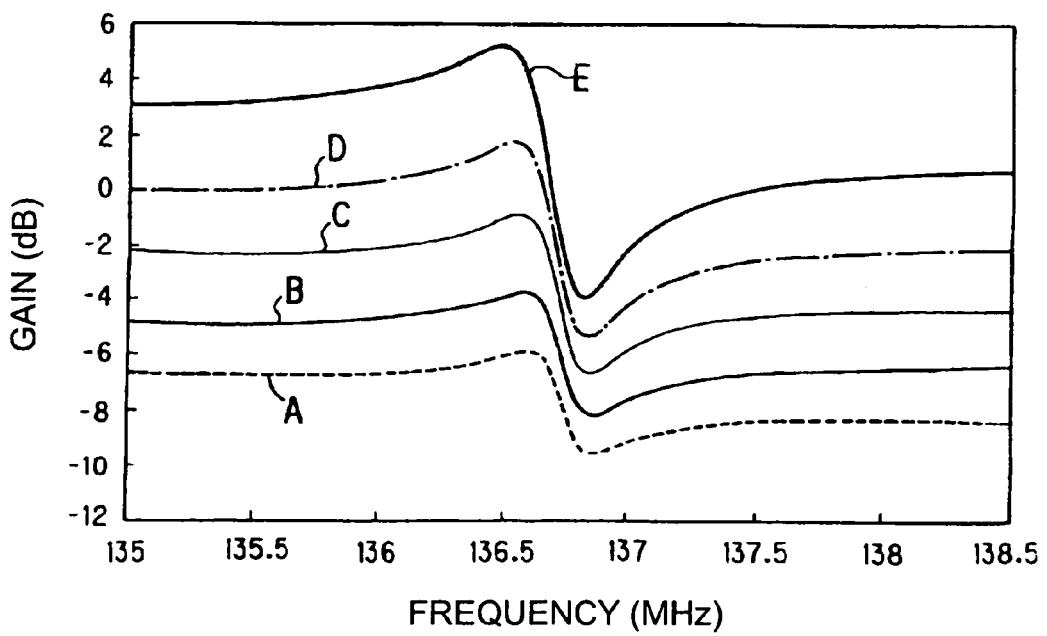
FIG. 10 shows a variation in the gain when the phase is changed by the phase-shift circuit of the feedback circuit.

FIG. 10 shows a variation in the gain when the phase is changed by using only the second phase-shift circuit 52. When the amount of change in the phase is increased by using the second phase-shift circuit 52, the gain of the feedback circuit is increased due to a change in the impedance of the feedback circuit. Thus, undesirable oscillation is, unfortunately, likely to occur. In other words, due to the use of a phase-adjusting coil in order to increase the amount of change in phase, a frequency at which a series resonance caused by an inter-electrode capacitance $C_0$ of the piezoelectric vibrator 34 and the phase-adjusting coil occurs is generated. The gain at this frequency may be greater than 1 due to an increase in gain of the entire oscillator circuit. In this case, since the oscillation starting time of the series resonance, which is not a mechanical vibration, caused by the phase-adjusting coil and the inter-electrode capacitance $C_0$ is short, the series resonance may start oscillation earlier than the oscillation of the piezoelectric vibrator 34. Also, when a phase-adjusting coil with a large inductance is used in order to increase the amount of change in the phase, the series resonance frequency of the coil and the inter-electrode capacitance $C_0$ is reduced to near the oscillation frequency of the piezoelectric vibrator 34. Thus, the gain of a series resonance circuits composed of the phase-adjusting coil and the inter-electrode capacitance $C_O$ is likely to be increased, and the series resonance caused by the phase-adjusting coil and the inter-electrode capacitance $C_O$ occurs before the oscillation of the piezoelectric vibrator 34. In FIG. 9, in order to simplify the comparison of the amount of change in the phase, a phase at a frequency that is away to some extent from the resonance frequency is set to 0 degrees.

In order to overcome the inconveniences described above, in the oscillator circuit 10 (see FIG. 1) or 50 (see FIG. 7) according to the present invention, the phase of the entire loop of the oscillator circuit 10 or 50 is adjusted by the first phase-shift circuit 26 that is separated, in terms of impedance, from the second phase-shift circuit 32 (see FIG. 1) or 52 (see FIG. 7) due to the amplifiers 22 and 24, which also function as impedance buffers. In other words, adjusting the phase so that the piezoelectric vibrator 34 can oscillate both in air and liquid by the second phase-shift circuit 32 or 52 provided in the feedback circuit is limited. Thus, the entire phase-shift condition is moved to an appropriate frequency by means of the first phase-shift circuit 26 provided in the amplifying circuit 20. Then, the gain at a predetermined oscillation frequency is obtained by the second phase-shift circuit 32 or 52, and the phase is adjusted to 0 degrees. Accordingly, a measuring apparatus with an excellent S/N ratio can be achieved. Also, undesirable oscillation can be avoided.

Figure 11:
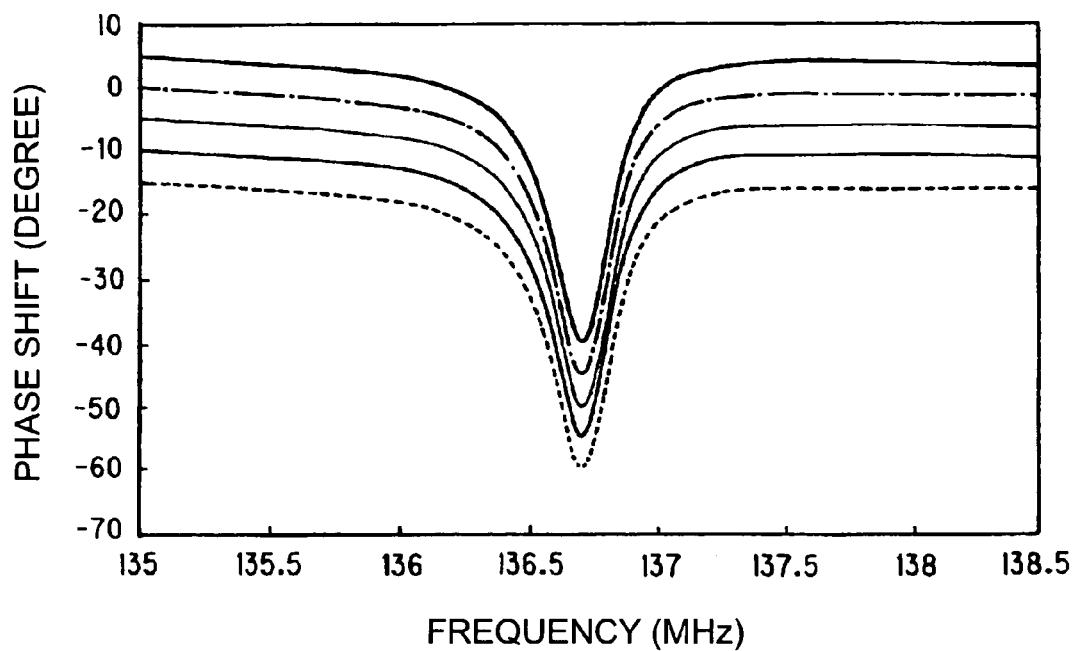
FIG. 11 shows a state in which the phase is changed by a phase-shift circuit of an amplifying circuit.

FIG. 11 shows the variation in phase of the entire loop of the oscillator circuit 10 or 50 by means of the first phase-shift circuit 26. As shown in the drawing, even if the reactance of the first phase-shift circuit 26 is adjusted in order to increase the amount of change in the phase, the width of frequencies at which the phase changes is not increased. Thus, even if the phase is changed by the first phase-shift circuit 26, oscillation at a frequency that is away (displaced) from the oscillation frequency of the piezoelectric vibrator 34 does not occur. Therefore, the phase condition for oscillation of the oscillator circuit 10 or 50 can be satisfied, while the frequency at which the oscillation occurs is stabilized. When the phase is changed by the first phase-shift circuit 26, there is no change in the gain of the feedback loop. Thus, the phase condition of the entire oscillator loop can be moved to an appropriate frequency by using the first phase-shift circuit 26. Therefore, the phase condition for oscillation both in air and liquid can be easily adjusted by using the second phase-shift circuit 32 or 52. Consequently, stable oscillation of the piezoelectric vibrator 34 both in air and liquid can be ensured.

Figure 12:
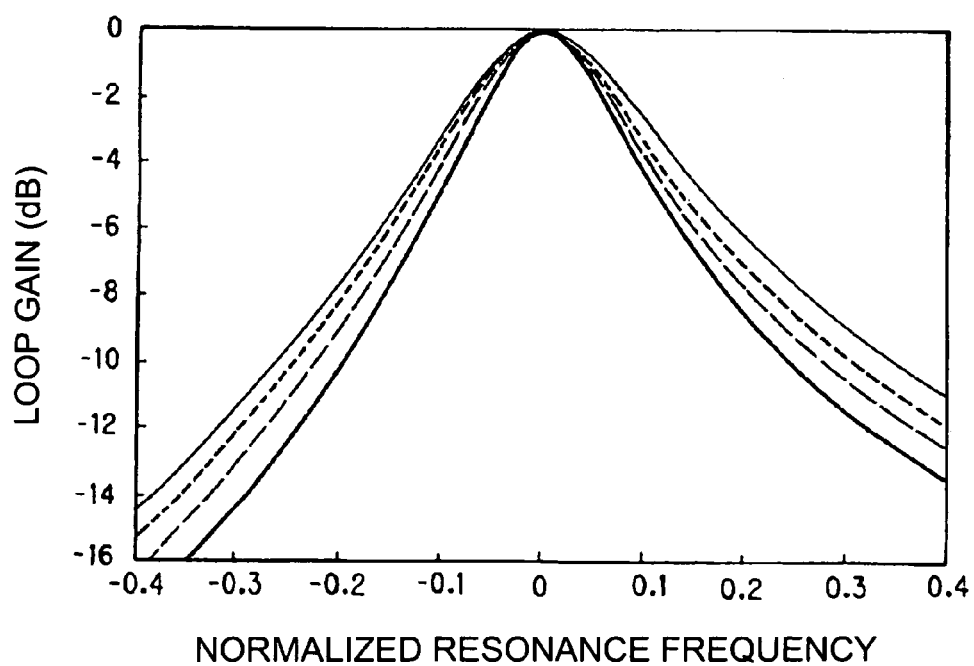
FIG. 12 shows the relationship between the gain and the resonance frequency of a tank circuit.

Also, in the oscillator circuit 50 according to the second embodiment, due to the tank circuit 56 provided in the second phase-shift circuit 52, not only can the series resonance caused by the inter-electrode capacitance $C_O$ of the piezoelectric vibrator 34 and the coil be prevented, but undesirable oscillation, such as parasitic oscillation, spurious oscillation of the piezoelectric vibrator 34, and feedback oscillation on the circuit, can also be prevented. In other words, the gain of the closed loop composed of the amplifying circuit 20 and the second phase-shift circuit 52 is changed by the tank circuit 56, as shown in FIG. 12. Here, when the tank circuit 56 is viewed from the loop side of the oscillator circuit 50, resonance of the tank circuit 56 at the resonance frequency significantly increases the impedance of the tank circuit 56. Thus, the loss in the gain of the closed loop due to the tank circuit 56 is 0. However, if an AC signal input to the tank circuit 56 is deviated from the resonance state, the impedance of the tank circuit 56 when viewed from the closed loop side is abruptly reduced, and the AC signal (current) deviated from the resonance frequency flows to the ground side via the capacitor 58 and reduces the gain of the closed loop. Thus, by setting the resonance frequency of the tank circuit 56 equal to the oscillation frequency of the piezoelectric vibrator 34, the gain of the closed loop at a frequency other than the oscillation frequency is reduced. Therefore, undesirable oscillation can be suppressed.

Figure 13:
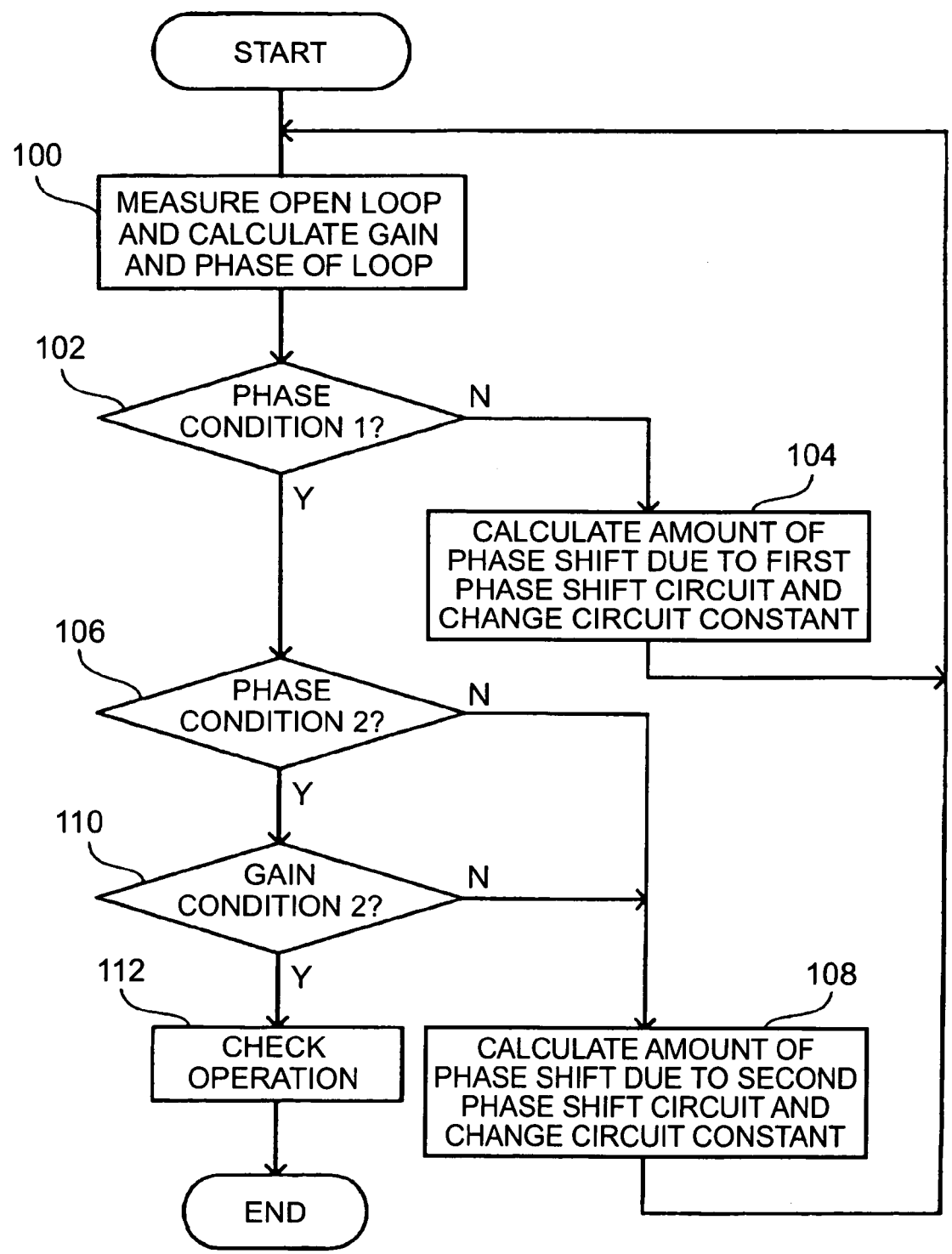
FIG. 13 is a flowchart showing an adjusting method for adjusting the oscillator circuit according to the second embodiment.

FIG. 13 is a flowchart showing an adjusting method for causing the piezoelectric vibrator 34 to oscillate both in air and liquid by using the oscillator circuit 50. A process for adjusting the piezoelectric vibrator 34 to oscillate both in air and liquid first by adjusting the piezoelectric vibrator 34 when in air and then by adjusting the piezoelectric vibrator 34 when immersed in liquid is shown in FIG. 13.

First, part of the closed loop of the oscillator circuit 50 is released to open the loop. For example, the oscillator circuit 50 becomes an open loop by separating the tank circuit 56 from the amplifying circuit 20, and a measuring device, such as a network analyzer, is connected at the separated portion. Then, the circuit characteristics of the open loop are measured by the measuring device in order to calculate the gain and phase of the open loop (step S100). In other words, the piezoelectric vibrator 34 is excited both in air and liquid in the open loop state, and the excitation frequencies both in air and liquid are measured. Then, gain and phase calculation processing for obtaining the changes in the gain and phase near a desired frequency at which oscillation is desired to occur is performed. In order to adjust the phase when the oscillator circuit 50 is a closed loop, the calculation of the gain and phase of the open loop is compensated in consideration of the difference of the impedances between the open loop and the closed loop.

Figure 14:
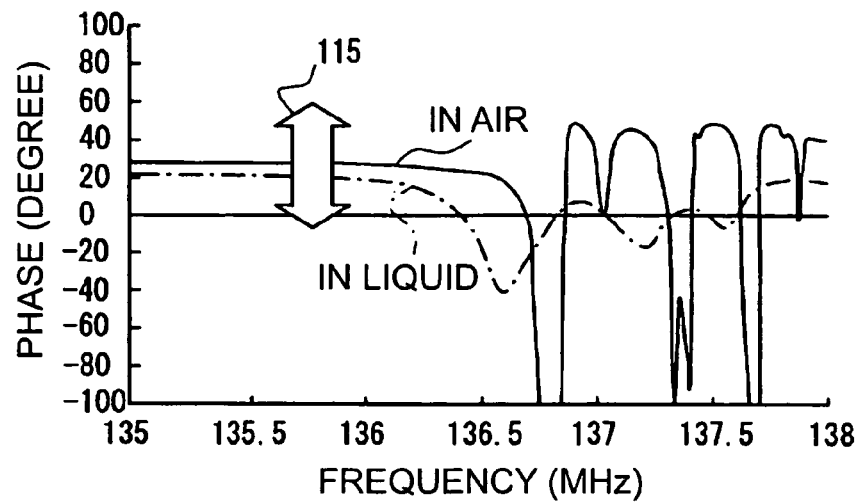
FIG. 14 shows an example of the measurement results of the phase change of the oscillator circuit.

FIG. 14 shows an example of the measurement of a change in the phase when the oscillator circuit is an open loop. In the drawing, there is a possibility for the oscillator circuit to oscillate at frequencies at which the curved lines indicating the phase change cross 0 degrees. Then, in step S102, it is determined whether or not phase condition 1 is satisfied. Phase condition 1 is to adjust the phase such that, when the piezoelectric vibrator 34 is caused to oscillate both in air and liquid, the phase is 0 and the gain is 1 or less in a frequency range higher than the frequency of a principal vibration except for frequencies near the frequency of the principal vibration. If phase condition 1 is not satisfied, the process proceeds to step S104 to perform first phase-shift adjusting processing. In the first phase-shift adjusting process, the amount of phase shift due to the first phase-shift circuit 26 is calculated, and, in a state in which the oscillator circuit is an open loop, a circuit constant of the first phase-shift circuit 26 is changed such that phase condition 1 is satisfied in a state in which the oscillator circuit is a closed loop. For example, the impedance of the coil 66 or the coupling capacitor 64 shown in FIG. 8 is changed. Accordingly, as shown by an arrow 115 in FIG. 14, the curved lines indicating the change of the phase are moved in the vertical direction, and the phase at a desired frequency can be adjusted. Then, the process returns to step S100 to measure the circuit characteristics of the open loop again. Then, it is determined whether or not phase condition 1 is satisfied (step S102).

If phase condition 1 is satisfied, the process proceeds from step S102 to step S106 to determine whether or not phase condition 2 is satisfied. Phase condition 2 is to adjust the phase such that, when the piezoelectric vibrator 34 is caused to oscillate both in air and liquid, the phase is approximately 0 degrees at a desired frequency near the resonance frequency of the piezoelectric vibrator 34 in a frequency range in which the phase significantly changes. If phase condition 2 is not satisfied, second phase-shift adjusting process is performed. In other words, the amount of phase shift due to the second phase-shift circuit 52 is calculated, and, in a state in which the oscillator circuit is an open loop, a circuit constant of the second phase-shift circuit 52 is changed such that phase condition 2 is satisfied in a state in which the oscillator circuit is a closed loop (step S108). In other words, for example, the inductance of the coil 80 of the phase-shift circuit part 54 shown in FIG. 8 is changed. Then, the process returns to step S100 to perform the processing of steps 100 to 106.

Figure 24:
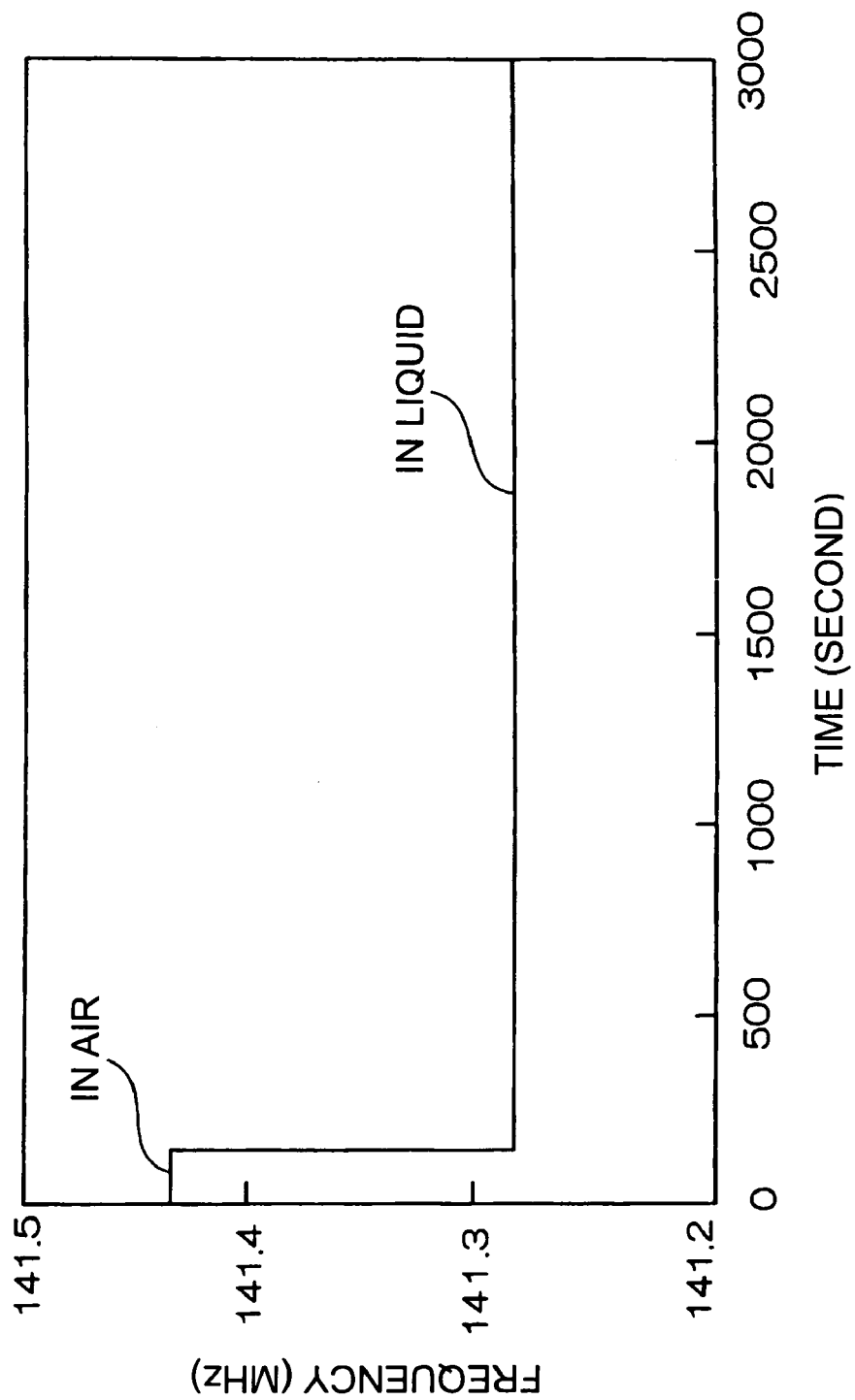
FIG. 24 shows an oscillation state both in air and liquid after adjustment.

If phase condition 2 is satisfied in step S106, it is determined whether or not gain condition 2 is satisfied (step S110). Gain condition 2 is to adjust the gain such that the gain of the closed loop is 1 or more when phase conditions 1 and 2 are satisfied. If gain condition 2 is not satisfied in Step S110, after performing the processing of step S108, which is a gain adjusting process, the process proceeds to step S100 to perform the processing of steps S100 to S110 again. In this gain adjustment, in order to ensure the oscillation of the piezoelectric vibrator 34, a negative resistance is set to be about three times larger than the impedance of the piezoelectric vibrator 34. If gain condition 2 is satisfied in step S110, the process proceeds from step S110 to step S112 to check the operation. In other words, the oscillator circuit 50 is changed to a closed loop, and the oscillation operation is actually performed both in air and liquid. Accordingly, oscillation of the piezoelectric vibrator 34 both in air and liquid can be ensured. Thus, by using the oscillator circuit according to the embodiments described above, a mass measuring apparatus with high reliability can be achieved. FIG. 24 shows a state of oscillation both in air and liquid when the oscillator circuit is adjusted as described above.

Figure 25:
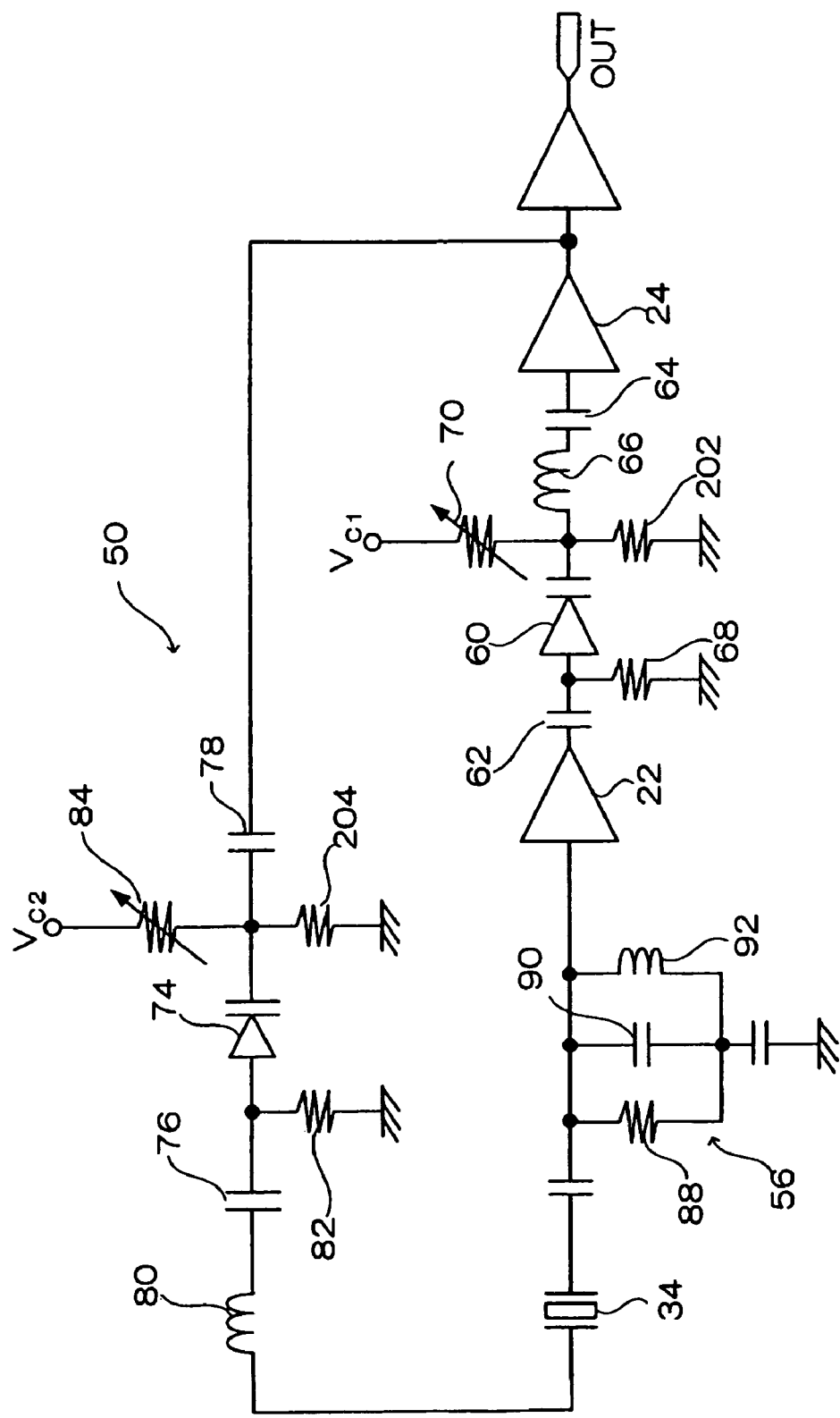
FIG. 25 is an explanatory diagram showing an oscillator circuit corresponding to the change in the characteristics in liquid.

When the piezoelectric vibrator 34 is immersed in liquid, the characteristics of the piezoelectric vibrator 34 are changed in various ways depending on the type and state of the liquid. The use of a voltage-controlled reactance control circuit in a phase-shift circuit causes the piezoelectric vibrator 34 to stably oscillate easily; thus a stable oscillation frequency can be achieved. For example, as shown in FIG. 25, the resistor 70 provided between the cathode of the variable capacitance diode 60 and a voltage input terminal and the resistor 84 provided between the cathode of the variable capacitance diode 74 and a voltage input terminal are changed to variable resistors. Here, resistors 202 and 204 connected to the cathodes of the variable capacitance diodes 60 and 74, respectively, are provided for dividing the control voltages $V_{C1}$ and $V_{C2}$, respectively. For example, the values of the control voltages $V_{C1}$ and $V_{C2}$ when the oscillator circuit is adjusted and the resistances of the variable resistors 70 and 84 are set as initial voltages. Then, when the piezoelectric vibrator 34 is immersed in any liquid, the resistances of the variable resistors 70 and 84 are adjusted on the basis of the set values so as to correspond to the change in the characteristics in the liquid. Thus, an oscillation operation in the liquid is stabilized. Therefore, the use of the oscillator circuit provides a measuring apparatus with an excellent S/N ratio. Here, the first phase-shift circuit 26 may include a plurality of amplifiers connected in series with each other. Also, the first phase-shift circuit 26 may include a temporal delay circuit including a delay element, a delay line, or the like. Also, three or more amplifiers that also function as impedance buffers may be provided.

Figure 15:
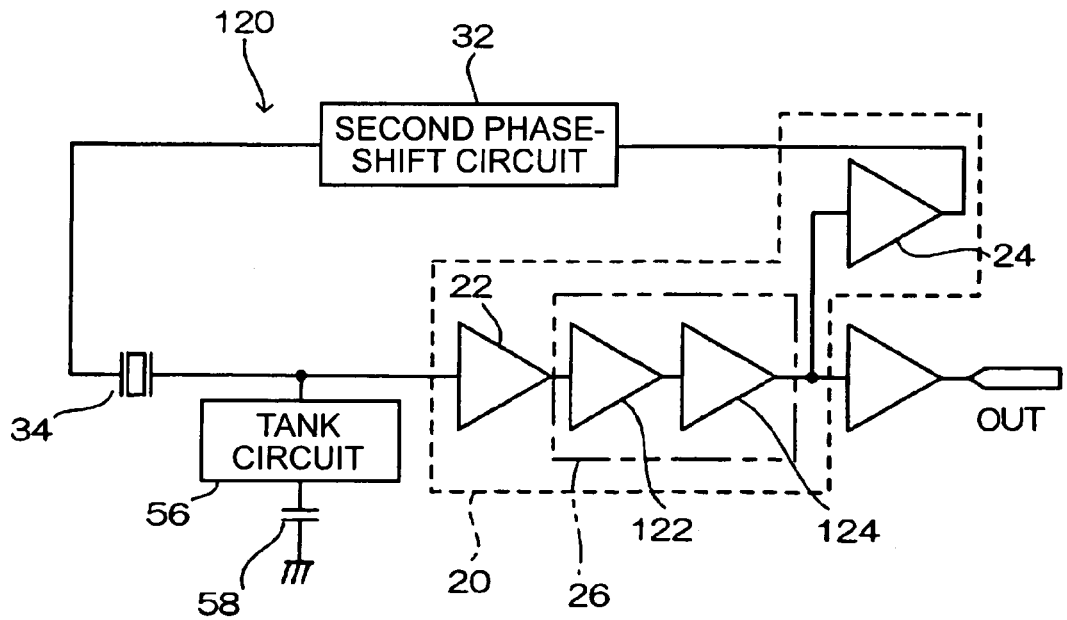
FIG. 15 is a diagram showing an oscillator circuit according to a third embodiment.

FIG. 15 is a block diagram showing an oscillator circuit 120 according to a third embodiment. An example in which the first phase-shift circuit 26 includes a plurality of amplifiers is shown in FIG. 15. In the oscillator circuit 120 according to the third embodiment, the first phase-shift circuit 26 provided in the amplifying circuit 20 includes two amplifiers 122 and 124. Each of the amplifiers 122 and 124 may be an amplifying circuit using a transistor, an operational amplifier, a differential amplifier, ECL, PECL, or the like, as in the amplifiers 22 and 24. Also, in the oscillator circuit 120, the second phase-shift circuit 32 and the piezoelectric vibrator 34 constitute a feedback circuit. The input side of the second phase-shift circuit 32 is connected to the output terminal of the amplifier 24, and the output side of the second phase-shift circuit 32 is connected to the input terminal of the amplifier 22 via the piezoelectric vibrator 34. Also, the tank circuit 56 is provided between the piezoelectric vibrator 34 and the amplifier 22. The tank circuit 56 is grounded via the capacitor 58.

In the oscillator circuit 120 arranged as described above, the two amplifiers 122 and 124 constituting the first phase-shift circuit 26 control the phase of the entire closed loop. Advantages similar to the oscillator circuit according to the embodiments described above can also be achieved in the oscillator circuit 120 according to the third embodiment. Here, three or more amplifiers constituting the first phase-shift circuit 26 may be provided.

Figure 16:
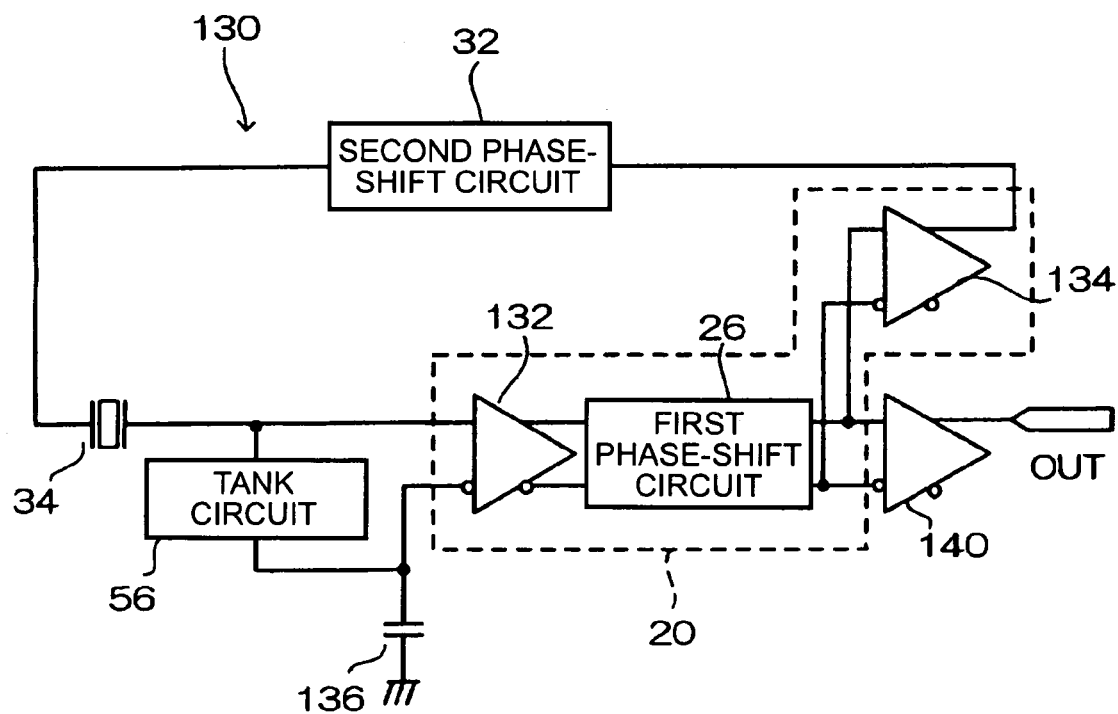
FIG. 16 is a diagram showing an oscillator circuit according to a fourth embodiment.

FIG. 16 is a block diagram showing an oscillator circuit 130 according to a fourth embodiment. In the oscillator circuit 130, amplifiers 132 and 134 constituting the amplifying circuit 20 and functioning as impedance buffers each include an inverting input terminal, a non-inverting input terminal, an inverting output terminal, and a non-inverting output terminal. Also, an output buffer 140 is an amplifier including an inverting input terminal, a non-inverting input terminal, an inverting output terminal, and a non-inverting output terminal.

The non-inverting input terminal of the amplifier 132 constituting the amplifying circuit 20 is connected to the other electrode of the piezoelectric vibrator 34 and to one end of the tank circuit 56. Also, the inverting input terminal of the amplifier 132 is grounded via a capacitor 136 and is connected to the other end of the tank circuit 56. The input side of the first phase-shift circuit 26 is connected to the non-inverting output terminal and the inverting output terminal of the amplifier 132. Also, the output side of the first phase-shift circuit 26 is connected to the non-inverting input terminal and the inverting input terminal of the amplifier 134 and to the non-inverting input terminal and the inverting input terminal of the output buffer 140. The non-inverting output terminal of the amplifier 134 is connected to the input side of the second phase-shift circuit 32. The output of the oscillator circuit 130 is captured from the non-inverting output terminal of the output buffer 140.

Figure 17:
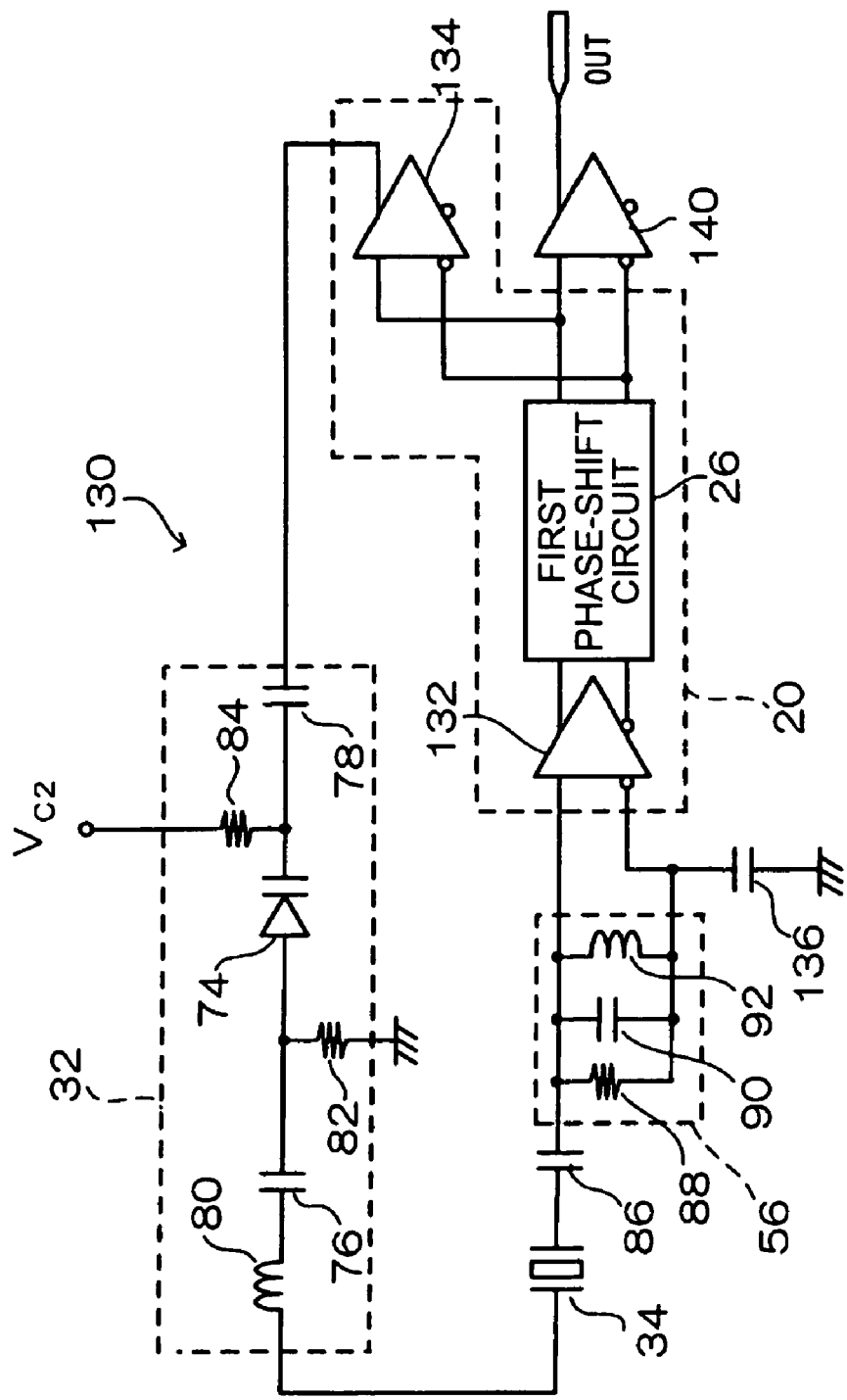
FIG. 17 is a circuit diagram showing a specific example of the fourth embodiment.

FIG. 17 shows a specific example of the oscillator circuit 130 according to the fourth embodiment. In this specific example, the second phase-shift circuit 32 constituting the feedback circuit is arranged in a similar manner to the phase-shift circuit part 54 of the second phase-shift circuit 52 in the second embodiment shown in FIG. 7. Also, the tank circuit 56 includes a parallel circuit composed of the resistor 88, the capacitor 90, and the coil 92. The first phase-shift circuit 26 constituting the amplifying circuit 20 may be a capacitance element, an inductance element, a variable capacitance diode, a delay element, an operational amplifier, a differential amplifier, or the like, as described above. Also, the differential amplifier may be ECL or PECL.

Figure 18:
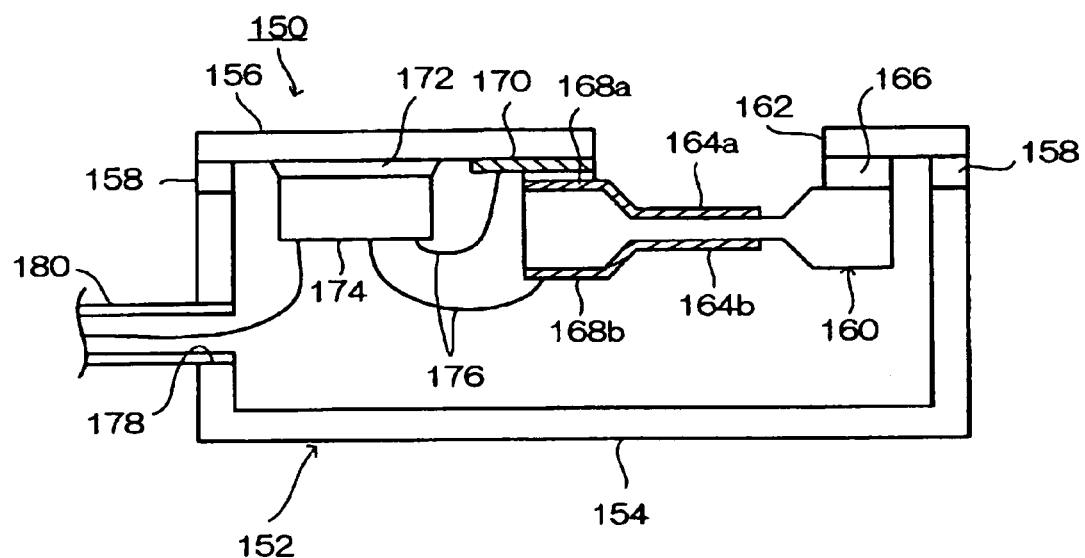
FIG. 18 is a sectional view of a mass measuring apparatus according to the embodiments.

FIG. 18 is a sectional view of a mass measuring apparatus 150 provided with the oscillator circuit according to any one of the embodiments described above. The mass measuring apparatus 150 includes a case 152 accommodating the oscillator circuit. The case 152 includes a box-type case main unit 154 and a cover 156. The cover 156 is formed by a flat plate and is fixed (watertight) to an opening of the case main unit 154 with an adhesive 158 in order to prevent intrusion of sample liquid into the case 152. Also, a window 162 for exposing a piezoelectric vibration reed 160 functioning as a piezoelectric vibrator is arranged in the cover 156.

In the embodiments, the piezoelectric vibration reed 160 is set to achieve high-frequency oscillation at a frequency of, for example, approximately 150 MHz by processing an AT-cut piezoelectric vibration plate to have a so-called reverse-mesa structure. The piezoelectric vibration reed 160 includes an excitation electrodes 164 (164a and 164b) on both sides of the reverse-mesa part. The excitation electrode 164a is provided with a sensitive film (not shown) for attracting a substance to be detected in the sample liquid. The window 162 of the cover 156 causes the sensitive film provided on the excitation electrode 164a to be exposed to contact the sample liquid. Then, the piezoelectric vibration reed 160 is firmly fixed around the window 162 inside the cover 156 with a conductive adhesive 166.

Also, the piezoelectric vibration reed 160 includes connection electrodes 168 (168a and 168b) which are integral with the excitation electrodes 164. In contrast, a circuit pattern part 170 made of a conductive material is provided on the inner surface of the cover 156. Also, an IC chip 174 is firmly fixed to the inner surface of the cover 156 with an adhesive 172. The IC chip 174 is an integrated circuit including the amplifiers 22 and 24, the output buffer 12, and the like of the oscillator circuit (for example, the oscillator circuit 50 shown in FIG. 7). The connection electrode 168a of the piezoelectric vibration reed 160 is electrically connected to the circuit pattern part 170 with the conductive adhesive 166 therebetween. The circuit pattern part 170 includes a wiring pattern. Also, the coil 66 of the first phase-shift circuit 26, the coil 80 of the phase-shift circuit part 54 constituting the second phase-shift circuit 52, and the like, which are not illustrated in FIG. 18, are arranged in the circuit pattern part 170. The circuit pattern part 170 is electrically connected to the IC chip 174 with a plurality of wires 176 made of gold or the like. Also, the connection electrode 168b of the piezoelectric vibration reed 160 is electrically connected to the IC chip 174 with the wires 176. Furthermore, the case main unit 154 has a through hole 178 in one side, and a cable 180 is connected to the through hole 178. The cable 180 includes a power line, a signal output line, and the like. The ends of such lines are connected to the IC chip 174.

Figure 19:
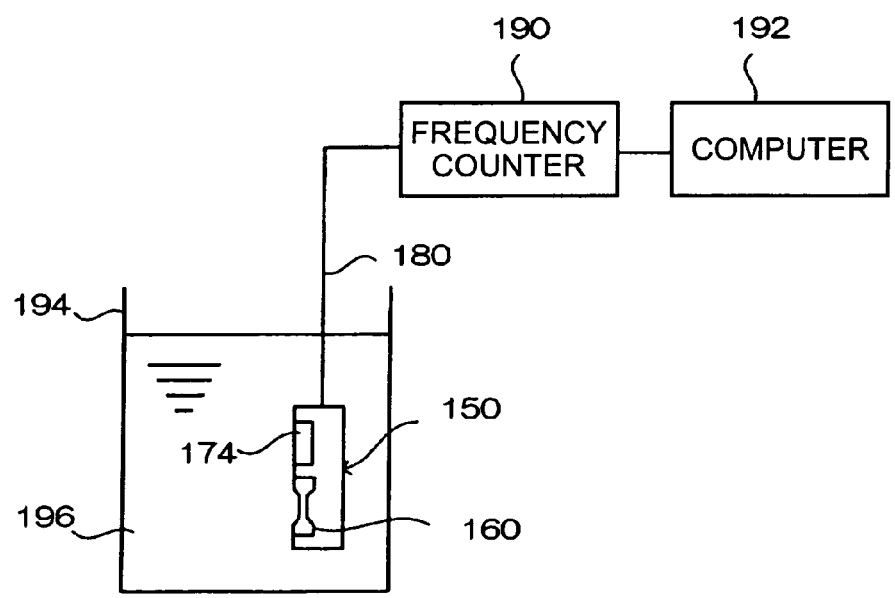
FIG. 19 shows an example when the mass measuring apparatus is used.
Figure 20:
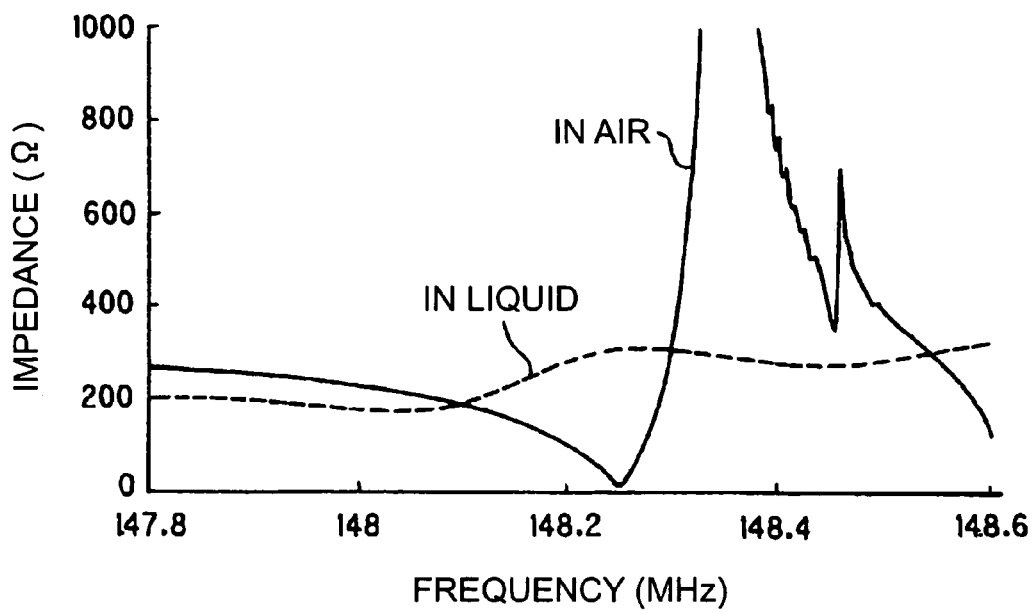
FIG. 20 shows the variation in the CI value of a piezoelectric vibrator in air and the variation in the CI value of a piezoelectric vibrator in liquid.
Figure 21:
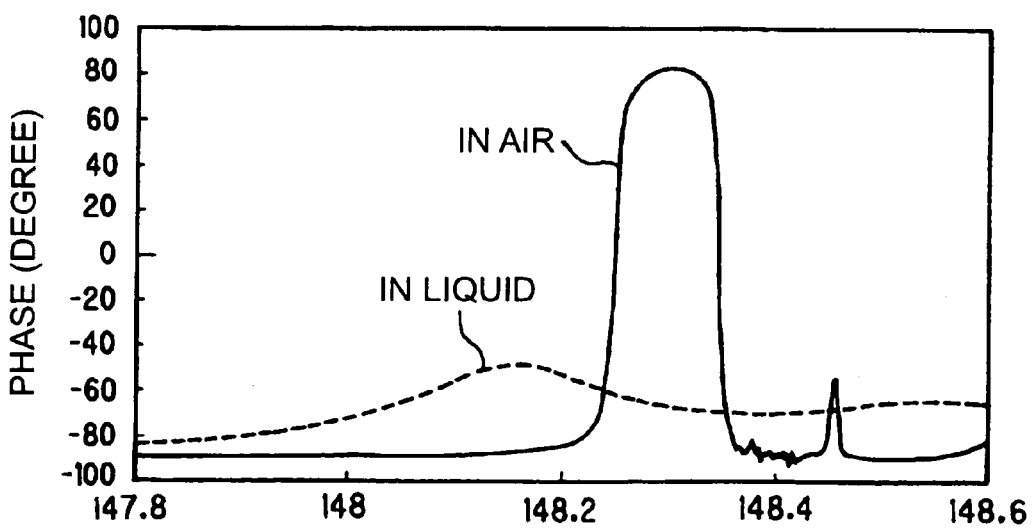
FIG. 21 shows the variation in phase of a piezoelectric vibrator in air and the variation in phase of a piezoelectric vibrator in liquid.
Figure 22:
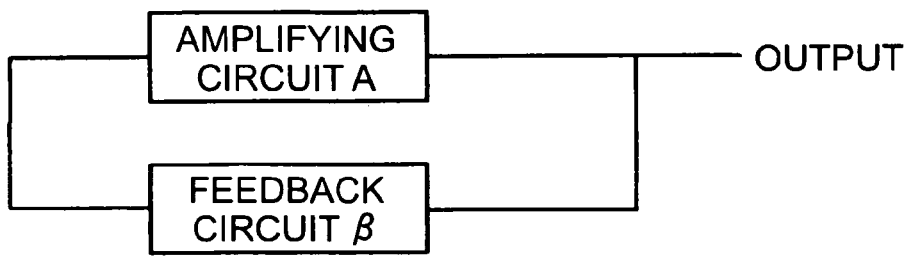
FIG. 22 is a block diagram showing a circuit structure of an oscillator circuit.

In the mass measuring apparatus 150 arranged as described above, the signal output line of the cable 180 is connected to a frequency counter 190, as shown in FIG. 19. The output side of the frequency counter 190 is connected to a computer 192, and the oscillation frequency of the mass measuring apparatus 150 is input to the computer 192. Then, the mass measuring apparatus 150 is immersed in a sample liquid 196 stored in a sample container 194. A substance to be detected in the sample liquid 196 becomes attached to the sensitive film provided on the excitation electrode 164a of the piezoelectric vibration reed 160. The computer 192 compares the oscillation frequency of the piezoelectric vibration reed 160 when the substance is deposited, the oscillation frequency being output from the frequency counter 190, with a reference oscillation frequency (oscillation frequency before deposition of the substance), and calculates the mass and concentration of the substance deposited on the sensitive film (the excitation electrode 164a) in accordance with an algorithm that is given in advance. In the oscillator circuit, only the piezoelectric vibration reed 160 may be accommodated inside the case 152. In this case, since the size of the case 152 is reduced, the mass measuring apparatus 150 can be arranged or inserted in a smaller part.

A specific method for measurement in liquid by the mass measuring apparatus 150 is performed as described below. First, liquid (solvent or solution) not including a substance to be detected is stored in the sample container 194, and the mass measuring apparatus 150 is immersed in the liquid. Then, after waiting until the resonance of the piezoelectric vibration reed 160 in the liquid is stabilized, the resonance frequency is stored as a reference frequency in the computer 192. Then, a predetermined amount of a sample (liquid) including the substance to be detected is added to the liquid in the sample container 194 to be diffused, and the added substance in the sample is deposited on the sensitive film on the piezoelectric vibration reed 160.

Also, measurement can be performed as described below. First, two sample containers 194 are provided. Only a liquid (for example, water or alcohol) not including a substance to be detected is poured in one of the sample containers 194. A sample including a substance dissolved or diffused in water or alcohol is poured in the other one of the sample containers 194. Then, a reference frequency (oscillation frequency) of the piezoelectric vibration reed 160 in liquid in the one of the sample containers 194 is obtained. After that, the mass measuring apparatus 150 is immersed in the other one of the sample containers 194 to measure the substance. Accordingly, the concentration and the like of the substance can be easily and precisely obtained. Alternatively, the mass measuring apparatus 150 in which the substance to be detected is deposited or responds to the sensitive film is immersed in liquid, such as water or alcohol. Then, a chemical agent that desorbs or resolves the substance is added to the liquid, so that the substance is eliminated from the sensitive film. Accordingly, the amount and the like of the substance deposited on the sensitive film can be measured.

In the oscillator circuit according to each of the embodiments described above, for example, an inter-electrode capacitance $C_0$ of the piezoelectric vibrator increases in accordance with a reduction in the size of the piezoelectric vibrator. Thus, the oscillator circuit can also be applied to a case where the amount of change in the phase of a piezoelectric vibrator is small.

Also, although the case in which the oscillator circuit according to each of the embodiments described above is applied to the mass measuring apparatus 150 for detecting a particular substance in liquid has been described above, the oscillator circuit according to the present invention can also be used for a measuring apparatus for measuring various types of minute physical quantities. For example, the oscillator circuit may be used as an odor sensor, a moisture sensor, a plating thickness monitor, an ion sensor, a viscosity/density sensor, and the like. When the oscillator circuit is used as an odor sensor, a sensitive film that selectively attracts an odor substance is applied to the surface of an excitation electrode. Also, when the oscillator circuit is used as a moisture sensor, a water-absorbing film is applied (refer to Japanese Unexamined Patent Application Publication No. 7-209165).

When the oscillator circuit is used as a plating thickness monitor, a piezoelectric vibrator for mass measurement is immersed in a plating liquid, together with a substance to be plated. In this case, the resonance frequency of a piezoelectric vibration reed is reduced in accordance with an increase in the plating thickness deposited on the surface of an excitation electrode. Thus, the plating thickness of the substance can be detected. Also, when the oscillator circuit is used as an ion sensor, an ion absorption substance is applied as a sensitive film. By measuring the amount of change in frequency of the piezoelectric vibrator reed by depositing the ion on the sensitive film, quantitative analysis of the ion in the sample liquid can be performed. It is desirable that sensitive films be provided on the excitation electrodes 164 that are arranged on both sides of the piezoelectric vibration reed 160 when the oscillator circuit is used in gas, for example, as an odor sensor. In this case, both sides of the piezoelectric vibration reed 160 are exposed so as to contact an odor substance. Accordingly, the amount of odor substance deposited on the piezoelectric vibration reed 160 is increased. Thus, the detection sensitivity is increased, and the measurement accuracy can thus be increased.

The mass measuring apparatus according to the present invention is capable of measuring minute physical quantities other than mass. The measurement principle for the mass measuring apparatus according to the present invention used as a viscosity/density sensor will be described below. An AT-cut piezoelectric vibrator performs thickness-shear vibration along the surface thereof. When the AT-cut piezoelectric vibrator is caused to oscillate in liquid, shear stress is generated between the AT-cut piezoelectric vibrator and the liquid. From Newton's Viscosity Law and the quartz vibrator vibration formula, the following equation representing the amount of change in the frequency due to the liquid viscosity can be obtained:

$$df = -f_0^{\frac{3}{2}} \cdot \left(\frac{\eta \rho_L}{\pi \mu \rho}\right)^{\frac{1}{2}} \quad \text{Formula 3}$$

where df represents the amount of change in the resonance frequency of the piezoelectric vibrator reed, $f_0$ represents an initial value of the resonance frequency of the piezoelectric vibrator reed, η represents the liquid viscosity, $\rho_L$ represents the liquid density, and μ represents the modulus of elasticity of the piezoelectric material. In the above equation, if one of the liquid viscosity η and the liquid density $\rho_L$ is constant, the other one corresponds to the amount of change in the resonance frequency in a one-to-one relationship. Thus, by measuring the amount of change in the resonance frequency, the change in the liquid viscosity or the change in the liquid density can be obtained.

What is claimed is:

1. An oscillator circuit comprising:
   a plurality of amplifiers, which also function as impedance buffers;
   a first phase-shift circuit connected between the amplifiers, the first phase-shift circuit being capable of adjusting the phase of an oscillator loop;
   a feedback circuit, an input side of the feedback circuit being connected to an output terminal of the amplifier that is connected to an output side of the first phase-shift circuit, an output side of the feedback circuit being connected to an input terminal of the amplifier that is connected to an input side of the first phase-shift circuit;
   a second phase-shift circuit provided in the feedback circuit, the second phase-shift circuit being capable of adjusting the phase and gain of the oscillator loop; and
   a piezoelectric vibrator provided in the feedback circuit, wherein the second phase-shift circuit and the piezoelectric vibrator are connected in series with each other.

2. An oscillator circuit according to claim 1, wherein the second phase-shift circuit includes a tank circuit that resonates at an oscillation frequency of the piezoelectric vibrator.

3. An oscillator circuit according to claim 1, wherein at least one of the first phase-shift circuit and the second phase-shift circuit includes a voltage-controlled phase-shift circuit capable of adjusting the phase of the oscillator loop in accordance with a received control voltage.

4. An oscillator circuit according to claim 1, wherein each of the amplifiers is a differential amplifier including an inverting input terminal, a non-inverting input terminal, an inverting output terminal, and a non-inverting output terminal.

5. An oscillator circuit according to claim 4, wherein the differential amplifier is an emitter-coupled logic circuit.

6. An oscillator circuit according to claim 1, wherein the piezoelectric vibrator is any one of an AT-cut quartz vibrator, a reverse-mesa AT-cut quartz vibrator, and a SAW vibrator.

7. An oscillator circuit according to claim 2, wherein at least one of the first phase-shift circuit and the second phase-shift circuit includes a voltage-controlled phase-shift circuit capable of adjusting the phase of the oscillator loop in accordance with a received control voltage.

8. An oscillator circuit according to claim 7, wherein each of the amplifiers is a differential amplifier including an inverting input terminal, a non-inverting input terminal, an inverting output terminal, and a non-inverting output terminal.

9. An oscillator circuit according to claim 8 wherein the differential amplifier is an emitter-coupled logic circuit.

10. An oscillator circuit according to claim 9, wherein the piezoelectric vibrator is any one of an AT-cut quartz vibrator, a reverse-mesa AT-cut quartz vibrator, and a SAW vibrator.

11. An oscillator circuit according to claim 2 wherein each of the amplifiers is a differential amplifier including an inverting input terminal, a non-inverting input terminal, an inverting output terminal, and a non-inverting output terminal.

12. An oscillator circuit according to claim 11 wherein the differential amplifier is an emitter-coupled logic circuit.

13. An oscillator circuit according to claim 12, wherein the piezoelectric vibrator is any one of an AT-cut quartz vibrator, a reverse-mesa AT-cut quartz vibrator, and a SAW vibrator.

14. An oscillator circuit according to claim 11, wherein the piezoelectric vibrator is any one of an AT-cut quartz vibrator, a reverse-mesa AT-cut quartz vibrator, and a SAW vibrator.

15. An oscillator circuit according to claim 2, wherein the piezoelectric vibrator is any one of an AT-cut quartz vibrator, a reverse-mesa AT-cut quartz vibrator, and a SAW vibrator.

16. An oscillator circuit according to claim 3, wherein each of the amplifiers is a differential amplifier including an inverting input terminal, a non-inverting input terminal, an inverting output terminal, and a non-inverting output terminal.

17. An oscillator circuit according to claim 3, wherein the piezoelectric vibrator is any one of an AT-cut quartz vibrator, a reverse-mesa AT-cut quartz vibrator, and a SAW vibrator.

18. An oscillator circuit according to claim 4, wherein the piezoelectric vibrator is any one of an AT-cut quartz vibrator, a reverse-mesa AT-cut quartz vibrator, and a SAW vibrator.

19. An oscillator circuit according to claim 5, wherein the piezoelectric vibrator is any one of an AT-cut quartz vibrator, a reverse-mesa AT-cut quartz vibrator, and a SAW vibrator.

20. An adjusting method for adjusting an oscillator circuit that includes an oscillator loop, a feedback circuit including a piezoelectric vibrator, and a first phase-shift circuit for adjusting the oscillator loop, the adjusting method comprising:

- a gain and phase calculation step of measuring circuit characteristics of the oscillator circuit and of calculating a gain and phase of the oscillator loop at an oscillation frequency of the oscillator circuit when the piezoelectric vibrator is disposed in gas and when the piezoelectric vibrator is disposed in liquid;
- a first phase-adjusting step of changing a circuit constant of the first phase-shift circuit of the oscillator circuit to adjust a phase condition such that the phase is 0 and the gain is 1 or less in a frequency range higher than the principal vibration frequency except for frequencies near the principal vibration frequency when the piezoelectric vibrator is disposed in gas and when the piezoelectric vibrator is disposed in liquid;
- a second phase-adjusting step of changing a circuit constant of the second phase-shift circuit of the oscillator circuit to adjust the phase of the oscillator circuit to approximately 0 degrees at a frequency near the oscillation frequency in a frequency range in which the phase significantly changes when the piezoelectric vibrator is disposed in gas and when the piezoelectric vibrator is disposed in liquid; and
- a gain adjusting step of changing the circuit constant of the second phase-shift circuit of the oscillator circuit to adjust the gain of the oscillator loop of the oscillator circuit to 1 or more when the piezoelectric vibrator is disposed in gas and when the piezoelectric vibrator is disposed in liquid.

21. An adjusting method according to claim 20, wherein, in the gain adjusting step, a negative resistance is set to be at least three times larger than the impedance of the piezoelectric vibrator.

22. An adjusting method according to claim 21, wherein each of the gain and phase calculation step, the first phase-adjusting step, the second phase-adjusting step, and the gain adjusting step is performed when the oscillator circuit is in an open loop.

23. An adjusting method according to claim 20, wherein each of the gain and phase calculation step, the first phase-adjusting step, the second phase-adjusting step, and the gain adjusting step is performed when the oscillator circuit is an open loop.

24. A mass measuring apparatus comprising the oscillator circuit as set forth in claim 1.

* * * * *